US008243769B2

(12) United States Patent
Furushima et al.

(10) Patent No.: US 8,243,769 B2
(45) Date of Patent: *Aug. 14, 2012

(54) SEMICONDUCTOR LIGHT EMITTING DEVICE, OPTICAL PICKUP UNIT AND INFORMATION RECORDING/REPRODUCTION APPARATUS

(75) Inventors: Yuji Furushima, Miyagi (JP); Abe Hiroaki, Miyagi (JP); Kudou Hisashi, Miyagi (JP); Fujimoto Tsuyoshi, Miyagi (JP); Kentaro Aoshima, Miyagi (JP)

(73) Assignee: Sony Corporation, Tokyo (JP)

( * ) Notice: Subject to any disclaimer, the term of this patent is extended or adjusted under 35 U.S.C. 154(b) by 1262 days.

This patent is subject to a terminal disclaimer.

(21) Appl. No.: 11/978,700

(22) Filed: Oct. 29, 2007

(65) Prior Publication Data

US 2008/0151960 A1 Jun. 26, 2008

(51) Int. Cl.
*H01S 5/00* (2006.01)
*G11B 7/00* (2006.01)
*H01L 29/18* (2006.01)

(52) U.S. Cl. . 372/50.12; 372/36; 372/50.1; 372/50.121; 372/50.122; 372/50.123; 372/50.124; 369/44.12; 369/53.26; 369/121; 257/88; 257/89; 257/90; 257/91; 257/E33.065; 257/E33.028; 257/777; 257/770; 257/33; 438/26; 438/28

(58) Field of Classification Search ............... 372/43.01, 372/50.1–50.124, 36; 257/88–91, E33.065, 257/E33.023, 700, 777; 438/26, 28; 369/44.12, 369/53.26, 121
See application file for complete search history.

(56) References Cited

U.S. PATENT DOCUMENTS

| | | | | |
|---|---|---|---|---|
| 6,965,552 B2 * | 11/2005 | Tokuda et al. | | 369/121 |
| 6,995,406 B2 * | 2/2006 | Tojo et al. | | 257/103 |
| 7,376,166 B2 * | 5/2008 | Hata et al. | | 372/50.121 |
| 7,400,568 B2 * | 7/2008 | Katou et al. | | 369/121 |
| 7,486,712 B2 * | 2/2009 | Hata et al. | | 372/50.121 |
| 7,672,351 B2 * | 3/2010 | Bessho et al. | | 372/50.121 |
| 7,773,654 B2 * | 8/2010 | Bessho et al. | | 372/50.122 |
| 7,817,694 B2 * | 10/2010 | Hata et al. | | 372/50.12 |
| 7,838,891 B2 * | 11/2010 | Lee et al. | | 257/88 |
| 7,916,766 B2 * | 3/2011 | Hata et al. | | 372/50.12 |
| 2003/0147333 A1 * | 8/2003 | Tokuda et al. | | 369/121 |
| 2004/0206975 A1 * | 10/2004 | Tojo et al. | | 257/103 |
| 2005/0025025 A1 * | 2/2005 | Nomura et al. | | 369/112.01 |

(Continued)

FOREIGN PATENT DOCUMENTS

| | | |
|---|---|---|
| JP | 08-046284 | 2/1996 |
| JP | 2000-098157 | 4/2000 |
| JP | 2001-230502 | 8/2001 |

(Continued)

*Primary Examiner* — Jessica Stultz
*Assistant Examiner* — Delma R Forde
(74) *Attorney, Agent, or Firm* — Robert J. Depke; Rockey, Depke & Lyons, LLC

(57) ABSTRACT

A semiconductor light emitting device downsized by devising arrangement of connection pads is provided. A second light emitting device is layered on a first light emitting device. The second light emitting device has a stripe-shaped semiconductor layer formed on a second substrate on the side facing to a first substrate, a stripe-shaped p-side electrode supplying a current to the semiconductor layer, stripe-shaped opposed electrodes that are respectively arranged oppositely to respective p-side electrodes of the first light emitting device and electrically connected to the p-side electrodes of the first light emitting device, connection pads respectively and electrically connected to the respective opposed electrodes, and a connection pad electrically connected to the p-side electrode. The connection pads are arranged in parallel with the opposed electrodes.

19 Claims, 20 Drawing Sheets

U.S. PATENT DOCUMENTS

| | | | |
|---|---|---|---|
| 2005/0220159 A1* | 10/2005 | Bessho et al. | 372/50.12 |
| 2008/0111142 A1* | 5/2008 | Furushima et al. | 257/91 |
| 2010/0189146 A1* | 7/2010 | Bessho et al. | 372/43.01 |
| 2010/0329296 A1* | 12/2010 | Hata et al. | 372/50.12 |
| 2011/0188532 A1* | 8/2011 | Hata et al. | 372/50.12 |
| 2011/0211610 A1* | 9/2011 | Saito et al. | 372/50.121 |
| 2012/0027040 A1* | 2/2012 | Hata et al. | 372/50.1 |
| 2012/0033701 A1* | 2/2012 | Bessho et al. | 372/50.1 |
| 2012/0033702 A1* | 2/2012 | Bessho et al. | 372/50.1 |

FOREIGN PATENT DOCUMENTS

| | | |
|---|---|---|
| JP | 2002-359425 | 12/2002 |
| JP | 2003-124572 | 4/2003 |
| JP | 2004-260152 | 9/2004 |
| JP | 2005-322881 | 11/2005 |
| JP | 2005-327905 | 11/2005 |
| JP | 2006-222147 | 8/2006 |
| JP | 2006-269987 | 10/2006 |

* cited by examiner

SEMICONDUCTOR LIGHT EMITTING DEVICE, OPTICAL PICKUP UNIT AND INFORMATION RECORDING/REPRODUCTION APPARATUS

CROSS REFERENCES TO RELATED APPLICATIONS

The present invention contains subject matter related to Japanese Patent Application JP 2006-305925 filed in the Japanese Patent Office on Nov. 10, 2006, the entire contents of which being incorporated herein by reference.

BACKGROUND OF THE INVENTION

1. Field of the Invention

The present invention relates to a semiconductor light emitting device including a plurality of light emitting devices, and an optical pickup unit and an information recording/reproduction apparatus provided therewith.

2. Description of the Related Art

In recent years, in the field of laser diodes (LD), a multi-wavelength laser device having a plurality of light emitting device sections with different light emitting wavelengths on the same substrate (or base) has been actively developed. The multi-wavelength laser device is used as, for example, a light source for an optical disk unit.

In such an optical disk unit, laser light in 700 nm band is used for reproduction of a CD (Compact Disk), and is used for recording and reproduction of a recordable optical disk such as a CD-R (CD Recordable), a CD-RW (CD Rewritable), and an MD (Mini Disk). In addition, laser light in 600 nm band is used for recording and reproduction of a DVD (Digital Versatile Disk). By mounting the multi-wavelength laser device on the optical disk unit, recording or reproduction becomes available for a plurality of types of existing optical disks. Further, a short-wavelength laser device (400 nm band) using a nitride Group III-V compound semiconductor typified by GaN, AlGaN mixed crystal, and GaInN mixed crystal has been realized, and they work toward practical use of such a short-wavelength laser device as a light source of a higher density optical disk. By developing a multi-wavelength laser device including the short-wavelength laser device, applications can be more widened.

As a three-wavelength laser device having a GaN light emitting device section described above, in the past, the following device has been suggested (Japanese Patent No. 3486900). In the device, a first light emitting device in 400 nm band (for example, 405 nm) is formed by growing a GaN semiconductor on a substrate made of GaN (gallium nitride). A second light emitting device is formed by providing a device having a light emitting device section in 600 nm band (for example, 650 nm) by growing an AlGaInP semiconductor and a device having a light emitting device section in 700 nm band (for example, 780 nm) by growing an AlGaAs semiconductor on the same substrate made of GaAs (gallium arsenide) in parallel with each other. The first light emitting device and the second light emitting device are layered in this order on a support base (heat sink).

SUMMARY OF THE INVENTION

To independently drive the respective light emitting device sections of the foregoing three-wavelength laser device, it is necessary to provide an electrode for injecting a current separately into the respective light emitting device sections and a connection pad for bonding a wire for every light emitting device section. However, if the respective connection pads are arranged without considering the results as before, the three-wavelength laser device is grown in size.

In view of the foregoing, in the invention, it is desirable to provide a semiconductor light emitting device downsized by devising arrangement of the connection pads, and an optical pickup unit and an information recording/reproduction apparatus provided therewith.

According to an embodiment of the invention, there is provided a first semiconductor light emitting device formed by layering a first light emitting device and a second light emitting device. The first light emitting device includes a stripe-shaped first light emitting device section and a stripe-shaped second light emitting device section that are formed in parallel with each other on a first substrate; and a stripe-shaped first electrode and a stripe-shaped second electrode that separately supply a current to the first light emitting device section and the second light emitting device section. The second light emitting device has a stripe-shaped third light emitting device section that is formed on an opposed face side of a second substrate arranged oppositely to the first substrate and emits light in a wavelength band different from the foregoing respective wavelength bands in the direction equal to the light emitting direction of the first light emitting device section and the second light emitting device section; a stripe-shaped third electrode that supplies a current to the third light emitting device section; a stripe-shaped first opposed electrode and a stripe-shaped second opposed electrode that are respectively arranged oppositely to the first electrode and the second electrode and are respectively and electrically connected to the first electrode and the second electrode; a first connection pad and a second connection pad that are respectively and electrically connected to the first opposed electrode and the second opposed electrode and wires are bonded thereto; and a third connection pad electrically connected to the third electrode and a wire is bonded thereto. The first connection pad, the second connection pad, and the third connection pad are arranged in parallel with the first opposed electrode and the second opposed electrode.

According to an embodiment of the invention, there is provided a first optical pickup unit including a light source and an optical system provided between a region where a recording medium is mounted and the light source. The light source includes a first semiconductor light emitting device. According to an embodiment of the invention, there is provided a first information recording/reproduction apparatus including the first optical pickup unit and an information processing section that sends inputted information to the first optical pickup unit and receives information recorded in the recording medium from the first optical pickup unit.

According to an embodiment of the invention, there is provided a second semiconductor light emitting device formed by layering a first light emitting device and a second light emitting device. The first light emitting device includes a stripe-shaped first light emitting device section that is formed on the first substrate; and a stripe-shaped first electrode that supplies current to the first light emitting device section. The second light emitting device includes a stripe-shaped second light emitting device section and a stripe-shaped third light emitting device section that are formed in parallel with each other on an opposed face side of a second substrate arranged oppositely to the first substrate; a stripe-shaped second electrode and a stripe-shaped third electrode that separately supply current to the second light emitting device section and the third light emitting device section; and a stripe-shaped first opposed electrode that is arranged oppositely to the first electrode and is electrically connected to the first electrode; a first connection pad that is electrically connected to the first opposed electrode; and a second connection pad and a third connection pad that are respectively and electrically connected to the second electrode and the third electrode. The first connection pad, the second connection pad, and the third connection pad are arranged side by side in a stripe-shaped region in parallel with the first opposed electrode.

According to an embodiment of the invention, there is provided a second optical pickup unit including a light source, and an optical system provided between a region where a recording medium is mounted and the light source. The light source includes the second semiconductor light emitting device. According to an embodiment of the invention, there is provided a second information recording/reproduction apparatus including the second optical pickup unit; and an information processing unit that sends inputted information to the second optical pickup unit and receives information recorded in a recording medium from the second optical pickup unit.

In the first and the second semiconductor light emitting devices, the first and the second optical pickup units and the first and the second information recording/reproduction apparatuses according to the embodiment of the invention, respectively, the connection pads (the first connection pad, the second connection pad, and the third connection pad) that are respectively and electrically connected to the electrodes (the first electrode (the first opposed electrode), the second electrode (the second opposed electrode), and the third electrode) that supply a current separately to the respective light emitting device sections (the first light emitting device section, the second light emitting device section, and the third light emitting device section) are all formed on the surface of the second light emitting device.

According to the first and the second semiconductor light emitting devices, the first and the second optical pickup units, and the first and the second information recording/reproduction apparatuses of the embodiment of the invention, the connection pads (the first connection pad, the second connection pad, and the third connection pad) are all formed on the surface of the second light emitting device. Therefore, an unused space created depending on the layout of the first connection pad, the second connection pad, and the third connection pad can be reduced to the minimum. As described above, by devising the layout thereof, the semiconductor light emitting device can be downsized.

Other and further objects, features and advantages of the invention will appear more fully from the following description.

DETAILED DESCRIPTION OF THE PREFERRED EMBODIMENTS

Descriptions will be given of embodiments of the invention in detail with reference to the drawings.

First Embodiment

Figure 1:
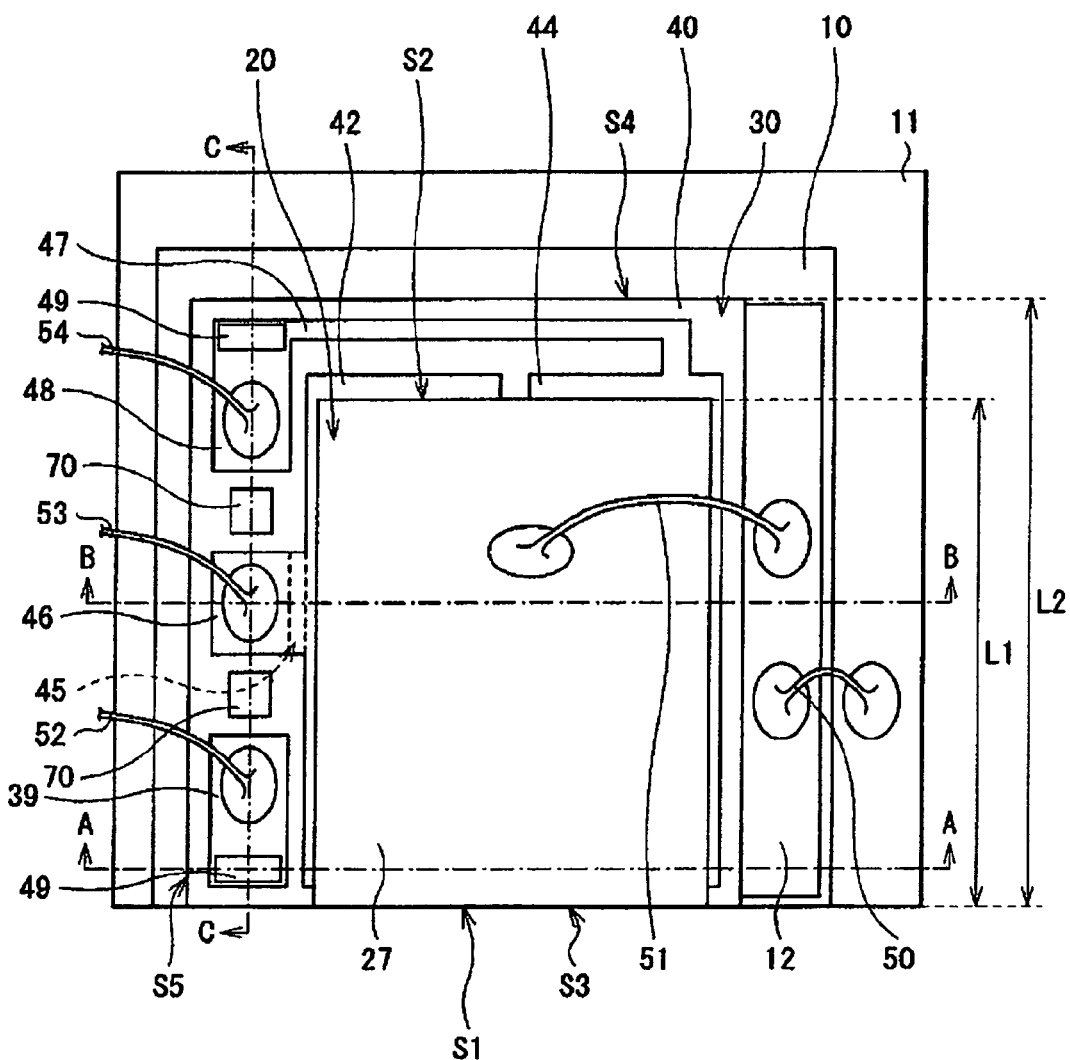
FIG. 1 is a top structure view of a semiconductor light emitting unit according to a first embodiment of the invention.
Figure 2:
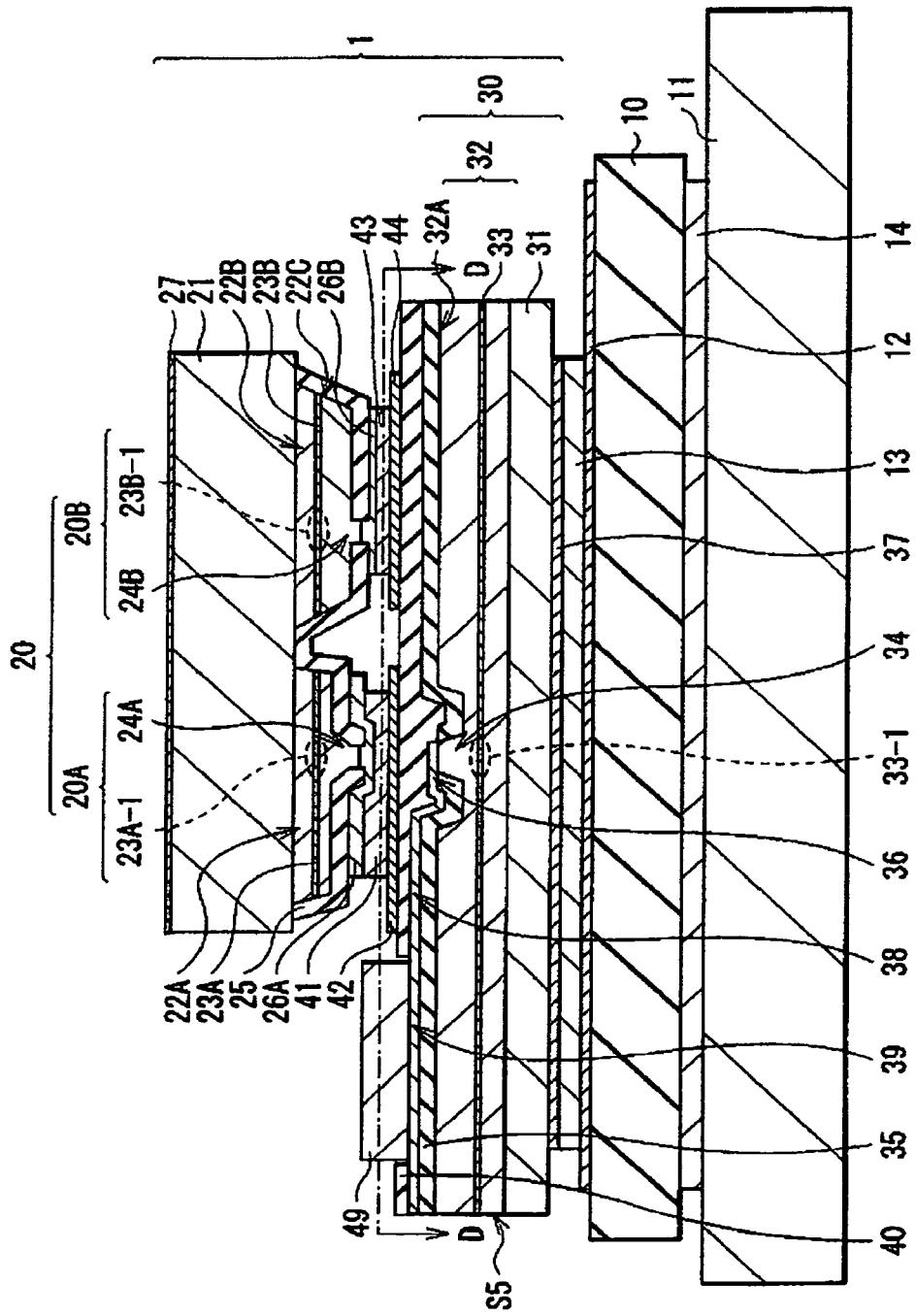
FIG. 2 is a cross sectional structure view taken along arrows A-A of the semiconductor light emitting unit of FIG. 1.
Figure 3:
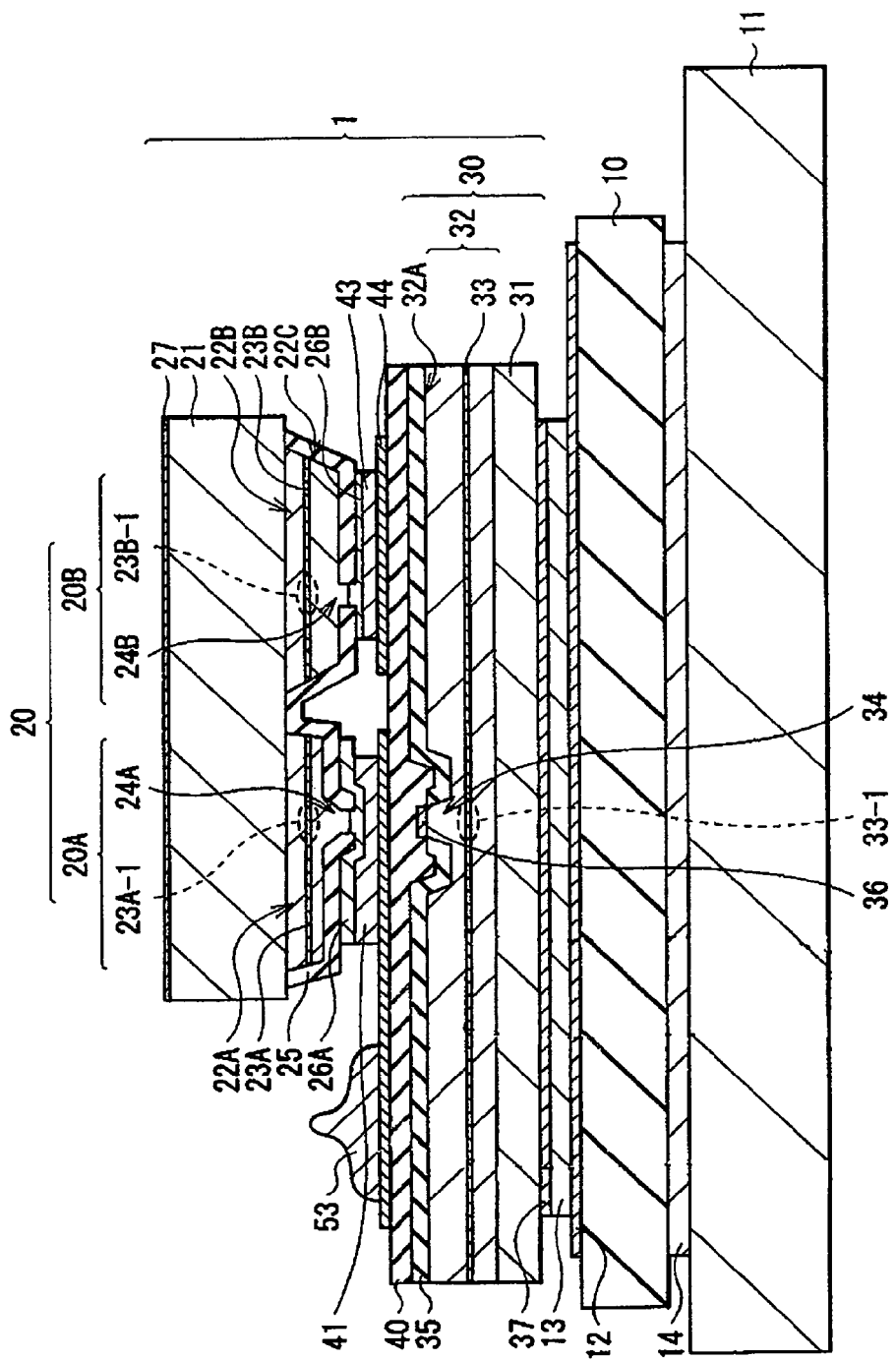
FIG. 3 is a cross sectional structure view taken along arrows B-B of the semiconductor light emitting unit of FIG. 1.
Figure 4:
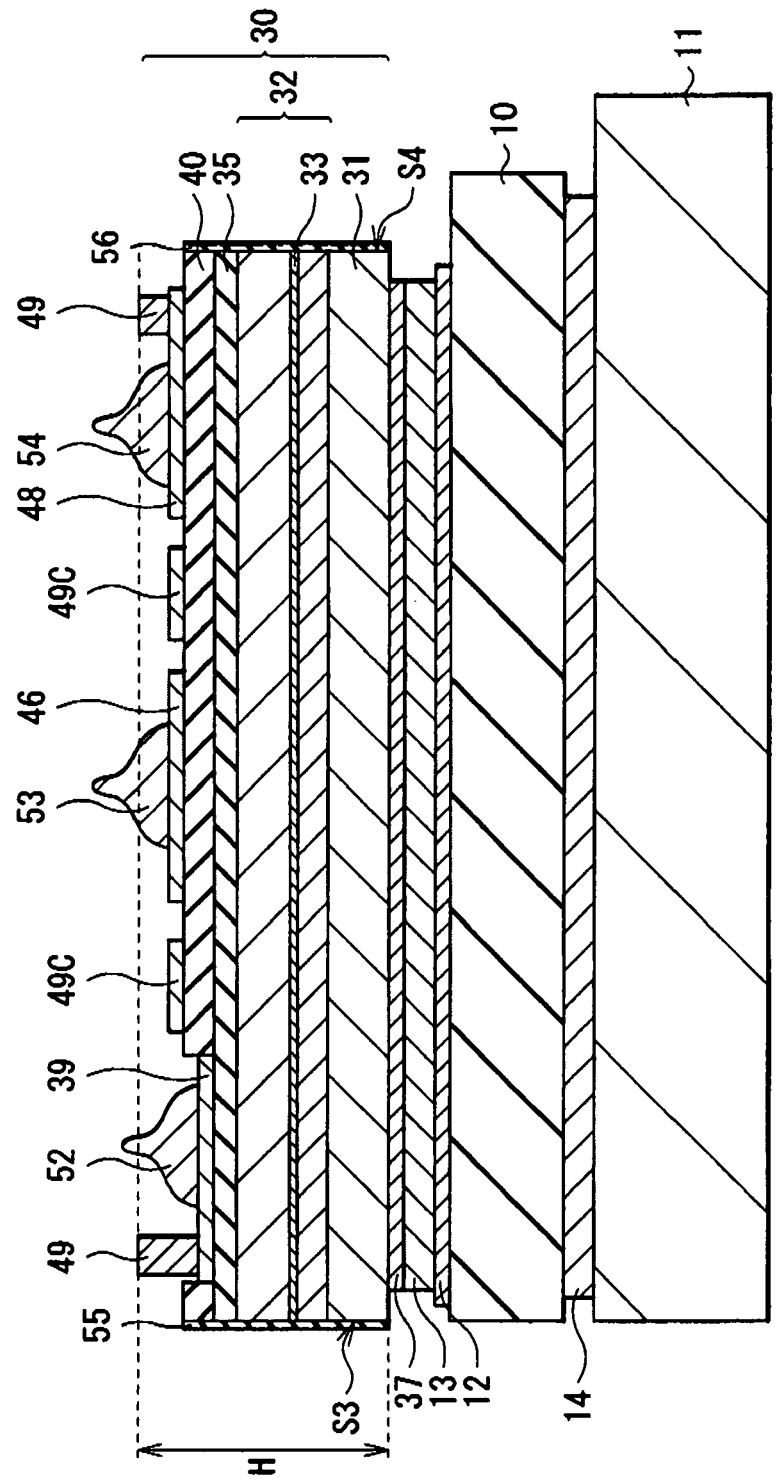
FIG. 4 is a cross sectional structure view taken along arrows C-C of the semiconductor light emitting unit of FIG. 1.
Figure 5:
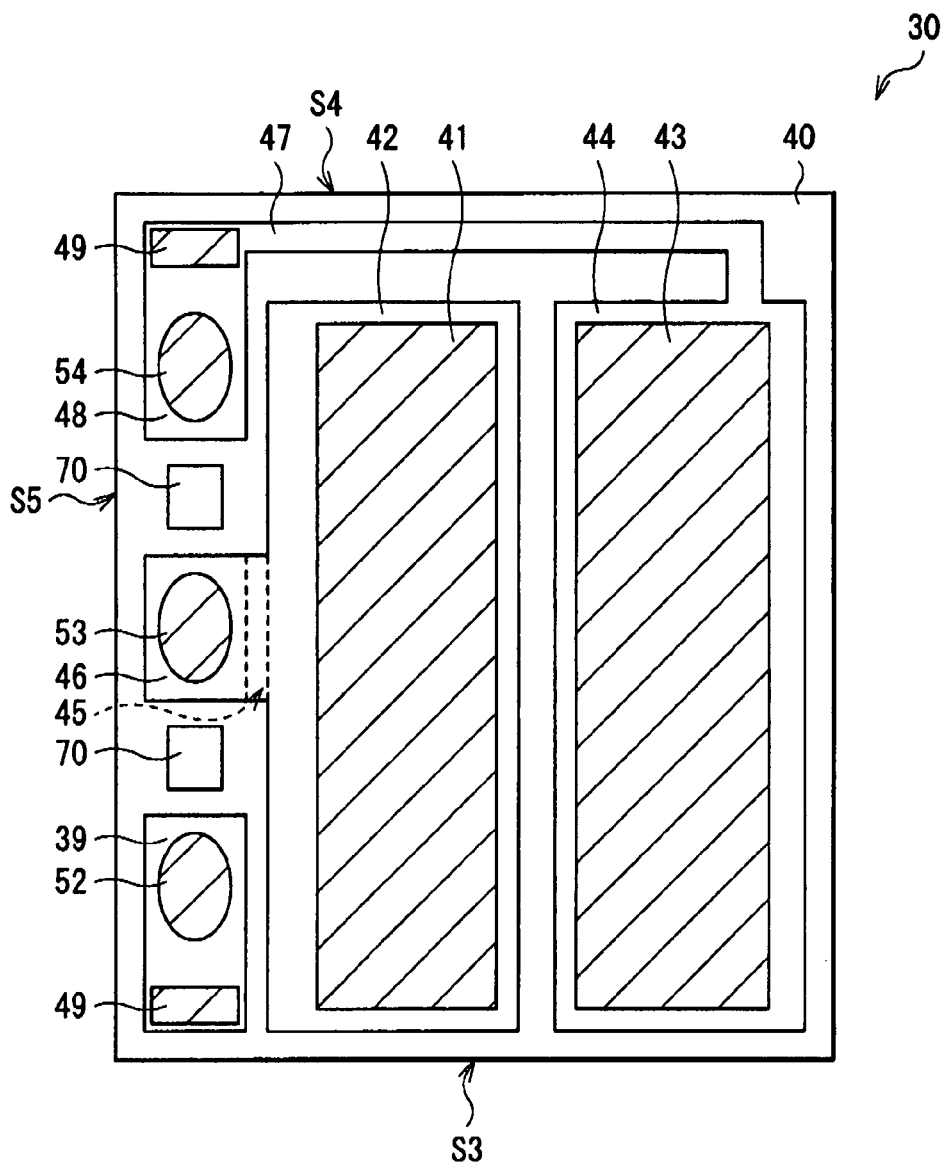
FIG. 5 is a cross sectional structure view taken along arrows D-D of the semiconductor light emitting unit of FIG. 2.

FIG. 1 shows a top view structure of a laser diode unit according to a first embodiment of the invention. FIG. 2 shows a cross sectional structure taken along arrows A-A of FIG. 1. FIG. 3 shows a cross sectional structure taken along arrows B-B of FIG. 1. FIG. 4 shows a cross sectional structure taken along arrows C-C of FIG. 1. FIG. 5 shows a cross sectional structure taken along arrows D-D of FIG. 2. As shown in FIG. 2, in the laser diode unit, a laser diode 1 is joined to a submount 10 as a support member, and a heat sink 11 as a heat release member is joined to the rear face of the submount 10. FIG. 1 to FIG. 5 schematically show the laser diode unit, and the dimensions and the shapes are different from those used actually.

As shown in FIG. 2, in the laser diode 1, a chip-shaped second light emitting device 30 and a first light emitting device 20 are layered in this order on the submount 10. The first light emitting device 20 includes a first device 20A capable of emitting light for a DVD in 600 nm band (for example, 650 nm) in the lamination in-plane direction, and a second device 20B capable of emitting light for a CD in 700 nm band (for example, 780 nm) in the lamination in-plane direction. Meanwhile, the second light emitting device 30 is a device capable of emitting light in around 400 nm band (for example, 405 nm) in the same direction as the light emitting direction of the first light emitting device 20. Therefore, the laser diode 1 has a function as a three-wavelength laser device.

Further, in the laser diode 1, the first light emitting device 20 is inverted (with the substrate side upward) and then is layered on the second light emitting device 30, so that a light emitting point 23A-1 (described later) of the first device 20B is close to a light emitting point 33-1 (described later) of the second light emitting device 30 as much as possible. Thereby, light emitted from the first light emitting device 20 and light emitted from the second light emitting device 30 can pass through the same light path to use a common lens system (not shown). The method of layering the first light emitting device 20 and the second light emitting device 30 is not limited thereto. For example, the first light emitting device 20 may be layered on the second light emitting device 30 so that a light emitting point 23B-1 (described later) of the first light emitting device 20 and the light emitting point 33-1 of the second light emitting device 30 are approximate to each other. Otherwise, the first light emitting device 20 may be layered on the second light emitting device 30 so that the midpoint between the light emitting point 23A-1 and the light emitting point 23B-1 of the first light emitting device 20 is approximate to the light emitting point 33-1 of the second light emitting device 30.

The submount 10 is made of a material with the high thermal conductivity such as AlN. Thereby, heat generated in the laser diode 1 is sufficiently diffused, the laser diode 1 is not exposed in high temperature, and thereby the reliability can be improved. As a material of the submount 10, Si or the like can be selected. However, in terms of the thermal conductivity, AlN is more advantageous. On the surface on the laser diode 1 side of the submount 10, an n-side common electrode 12 is formed. The n-side common electrode 12 is made of, for example, a metal thin film such as Au (gold). As shown in FIG. 1, the n-side common electrode 12 is connected to an n-side electrode 27 (described later) of the first light emitting device 20 and an n-side electrode 37 (described later) of the second light emitting device 30, respectively.

The heat sink 11 is made of, for example, a material having electrical and heat conductance such as Cu (copper). The surface is coated with a thin film (not shown) made of Au or the like. As shown in FIG. 1, one end of a wire 50 is bonded to the surface of the heat sink 11. The other end of the wire 50 is bonded to the surface of the n-side common electrode 12. The heat sink 11 and the n-side common electrode 12 are electrically connected to each other through the wire 50. Thereby, heat of the laser diode 1 diffused through the submount 10 is released outside to maintain the laser diode 1 at an appropriate temperature. In addition, a current supplied from an external power source (not shown) can be effectively conducted to the laser diode 1 through the heat sink 11.

Between the laser diode 1 and the submount 10, a welding layer 13 for joining the laser diode 1 to the submount 10 is provided. Between the submount 10 and the heat sink 11, a welding layer 14 for joining the submount 10 to the heat sink 11 is provided (refer to FIG. 2). The welding layer 13 is made of, for example, Au—Sn (gold tin) solder with the welding temperature of 250 deg C. The welding layer 14 is made of, for example, a low-melting solder with the welding temperature about from 150 deg C. to 170 deg C. containing In (indium) or the like as a main component.

First Light Emitting Device 20

In the first light emitting device 20, as shown in FIG. 2, the first device 20A capable of emitting light in 600 nm band (for example, 650 nm) and the second device 20B capable of emitting light in 700 nm band (for example, 780 nm) are formed in parallel with each other on a common first substrate 21. The first device 20A is made of a GaP Group III-V compound semiconductor. The second device 20B is made of a GaAs Group III-V compound semiconductor. The GaP Group III-V compound semiconductor herein means a semiconductor containing at least Ga (gallium) of Group 3B elements in the short period periodic table and at least P (phosphorus) of Group 5B elements in the short period periodic table. The GaAs Group III-V compound semiconductor means a semiconductor containing at least Ga of Group 3B elements in the short period periodic table and at least As (arsenic) of Group 5B elements in the short period periodic table. Both the GaP Group III-V compound semiconductor and the GaAs Group III-V compound semiconductor are materials opaque to light from visible light to infrared light.

In the first device 20A, a semiconductor layer 22A (first light emitting device section) is grown on the first substrate 21. The semiconductor layer 22A is a laser device section in which an n-type cladding layer, an active layer 23A, a p-type cladding layer, and a p-side contact layer are layered in this order from the first substrate 21 side in the lamination direction. These layers other than the active layer 23A are not particularly shown in the figures.

The first substrate 21 is made of, for example, n-type GaP that is cut out part of a large GaP substrate. The n-type cladding layer is made of n-type AlGaInP, for example. The active layer 23A has a multi-quantum well structure composed of a well layer and a barrier layer that are respectively formed from $Al_{x1}Ga_{x2}In_{1-x1-x2}P$ ($0<x1<1$, $0<x2<1$, and $0<1-x1-x2<1$) with the composition different from each other, for example. The p-type cladding layer is made of p-type AlGaInP, for example. The p-side contact layer is made of p-type GaP, for example. Part of the p-type cladding layer and the p-side contact layer have a stripe-shaped ridge 24A extending in the uniaxial direction (direction perpendicular to the sheet of FIG. 2). Thereby, current confinement can be made. The extending direction of the ridge 24A corresponds to the resonator direction of the first device 20A. In the active layer 23A, the region corresponding to the ridge 24A is the light emitting point 23A-1.

In the second device 20B, a semiconductor layer 22B (second light emitting device section) is grown on the first substrate 21 in the same manner as the first device 20A. The semiconductor layer 22B is a laser device section in which an n-type cladding layer, an active layer 23B, a p-type cladding layer, and a p-side contact layer are layered in this order from the first substrate 21 side in the lamination direction. These layers other than the active layer 23B are not particularly shown in the figures.

The n-type cladding layer is made of n-type AlGaAs, for example. The active layer 23B has a multi-quantum well structure composed of a well layer and a barrier layer that are respectively formed from $Al_{x3}Ga_{1-x3}As$ ($0<x3<1$) with the composition different from each other, for example. The p-type cladding layer is made of p-type AlGaAs, for example. The p-side contact layer is made of p-type GaAs, for example. Part of the p-type cladding layer and the p-side contact layer have a stripe-shaped ridge 24B extending in a direction in parallel with the resonator direction of the first device 20A. Thereby, current confinement can be made. The extending direction of the ridge 24B corresponds to the resonator direction of the second device 20B. In the active layer 23B, the region corresponding to the ridge 24B is the light emitting point 23B-1.

An insulating layer 25 is provided on the surface (hereinafter referred to as surface 22C) of the semiconductor layers 22A and 22B other than the top face of the ridges 24A and 24B (surface of the p-side contact layer). Between the surface 22C and the insulating layer 25, for example, a layer for enhancing contact characteristics between the surface 22C and the insulating layer 25 or the like can be arranged. The insulating layer 25 has both the high thermal conductivity and the high insulation. In the insulating layer 25, for example, a layer including an insulating material that contains a main material such as AlN (aluminum nitride), BN (boron nitride), SiC (silicon carbide), GaN, and AlGaInN (aluminum gallium indium nitrogen) and does not contain oxygen; and a layer including an insulating material such as AlNOx, BNOx, $SiO_2$, GaNOx, and AlGaInNOx are layered in this order from the surface 22C side.

Since the insulating layer 25 is provided on the surface 22C, a current flows only from the region provided with no insulating layer 25, that is, from the top face of the ridges 24A and 24B into the active layers 23A and 23B. Therefore, the insulating layer 25 also has a current confinement function.

A p-side electrode 26A (first electrode) is provided on the surface that continues from the top face of the ridge 24A to part of the surface of the insulating layer 25. The p-side electrode 26A is electrically connected to the p-side contact layer of the ridge 24A. As will be described later, the p-side electrode 26A is arranged oppositely to an opposed electrode 42 with a welding layer 41 of the second light emitting device 30 in between, and is electrically connected to the opposed electrode 42 with the welding layer 41 in between. A p-side electrode 26B (second electrode) is provided on the surface that continues from the top face of the ridge 24B to part of the surface of the insulating layer 25. The p-side electrode 26B is electrically connected to the p-side contact layer of the ridge 24B. As will be described later, the p-side electrode 26B is arranged oppositely to an opposed electrode 44 with a welding layer 43 of the second light emitting device 30 in between, and is electrically connected to the opposed electrode 44 with the welding layer 43 in between. Meanwhile, on the rear face of the first substrate 21, the n-side electrode 27 is provided. The n-side electrode 27 is electrically connected to the first substrate 21. As shown in FIG. 1, one end of a wire 51 is bonded to the surface of the n-side electrode 27. The other end of the wire 51 is bonded to the surface of the n-side common electrode 12. The n-side electrode 27 and the n-side common electrode 12 are electrically connected to each other through the wire 51.

The p-side electrodes 26A and 26B have a multilayer structure in which, for example, Ti (titanium), Pt (platinum), and Au (gold) are layered in this order. The n-side electrode 27 has a structure in which, for example, an alloy of Au and Ge (germanium), Ni (nickel), and Au are layered in this order from the first substrate 21 side.

On a pair of cleavage faces S1 and S2 perpendicular to the extending direction (resonator direction) of the ridges 24A and 24B, a pair of reflector films (not shown) is formed. The reflector film formed on the cleavage face S1 on the main emitting side is made of, for example, $Al_2O_3$ (aluminum oxide), and is adjusted to have the low reflectance. Meanwhile, the reflector film formed on the cleavage face S2 on the other side of the main emitting side is made of, for example, a lamination in which an aluminum oxide layer and a $TiO_2$ (titanium oxide) layer are alternately layered, and is adjusted to have the high reflectance. Thereby, light respectively generated in the light emitting region of the active layer 23A (light emitting point 23A-1) and the light emitting region of the active layer 23B (light emitting point 23B-1) travels between the pair of reflector films, amplified, and emitted as a beam from the reflector film on the low reflectance side. It is possible that light leaked from the reflector film on the high reflectance side is detected by, for example, a photo detector or the like (not shown), the detected light is converted to photocurrent, and thereby the optical power of the light emitted from the low reflectance side is measured.

Second Light Emitting Device 30

The second light emitting device 30 is a laser diode capable of emitting light in around 400 nm (for example, 405 nm), and is made of a nitride Group III-V compound semiconductor. The nitride Group III-V compound semiconductor herein means a semiconductor containing at least one of Group 3B elements in the short period periodic table, and at least N (nitrogen) of Group 5B elements in the short period periodic table.

As shown in FIG. 1 and FIG. 2, in the second light emitting device 30, a semiconductor layer 32 (third light emitting device section) is grown on a second substrate 31. The second light emitting device 30 has resonator length L2 longer than resonator length L1 of the first light emitting device 20. The semiconductor layer 32 includes, for example, an n-type cladding layer, an active layer 33, a p-type cladding layer, and a p-side contact layer form the second substrate 31 side. These layers other than the active layer 33 are not particularly shown in the figures.

Figure 6:
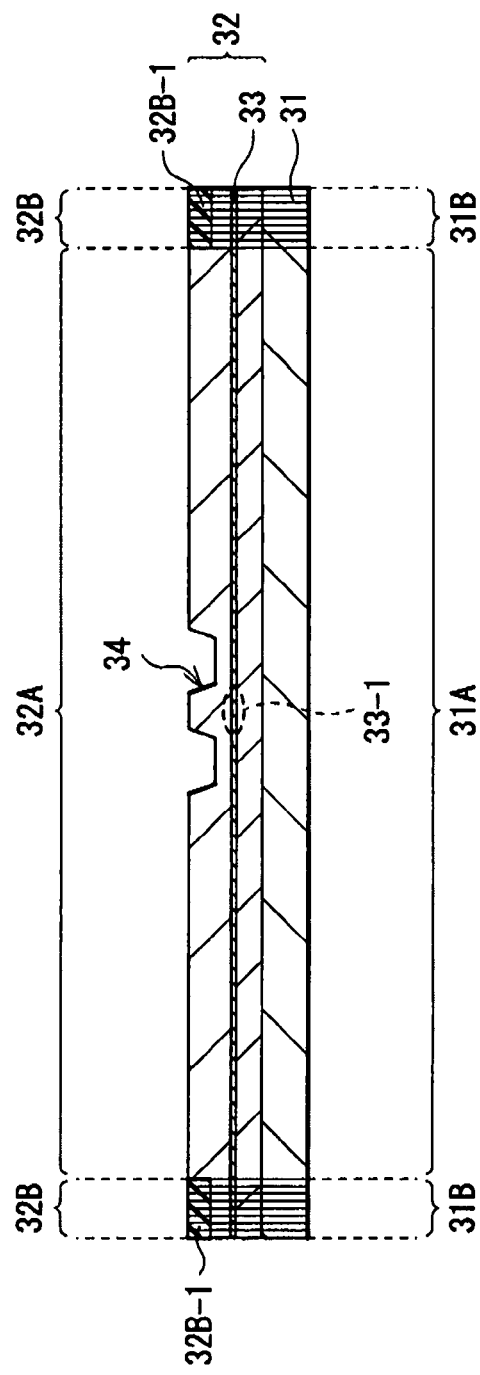
FIG. 6 is a cross sectional structure view for explaining a defect region in a second substrate.

As shown in the exploded view of FIG. 6, the second substrate 31 is made of n-type GaN (gallium nitride) in which a plurality of high-defect regions 31B (second region) having the average dislocation density (second average dislocation density) higher than that of a low-defect region 31A (first region) adjacent to the low-defect region 31A having the low average dislocation density (first average dislocation density). In this embodiment, in the second substrate 31, the low-defect region 31A exists in the central region in the lateral direction (direction perpendicular to the resonator direction), and the high-defect region 31B exists in the region (region including the side face) on the both sides of the low-defect region 31A.

Figure 7:
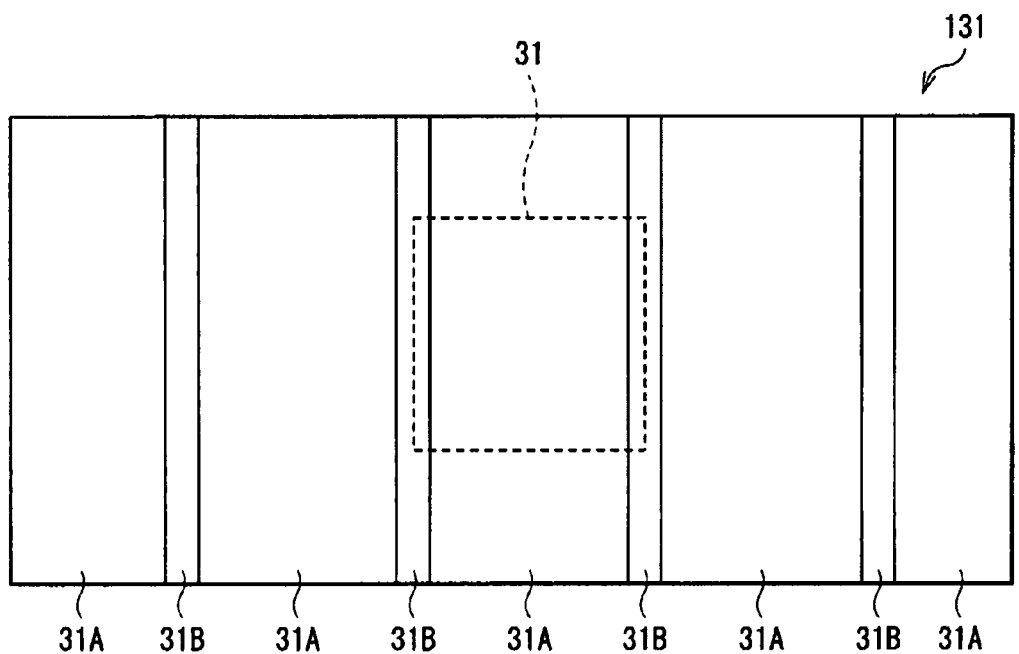
FIG. 7 is a plan structure view for explaining an example of a large GaN substrate before cutting out the second substrate of FIG. 6.
Figure 8:
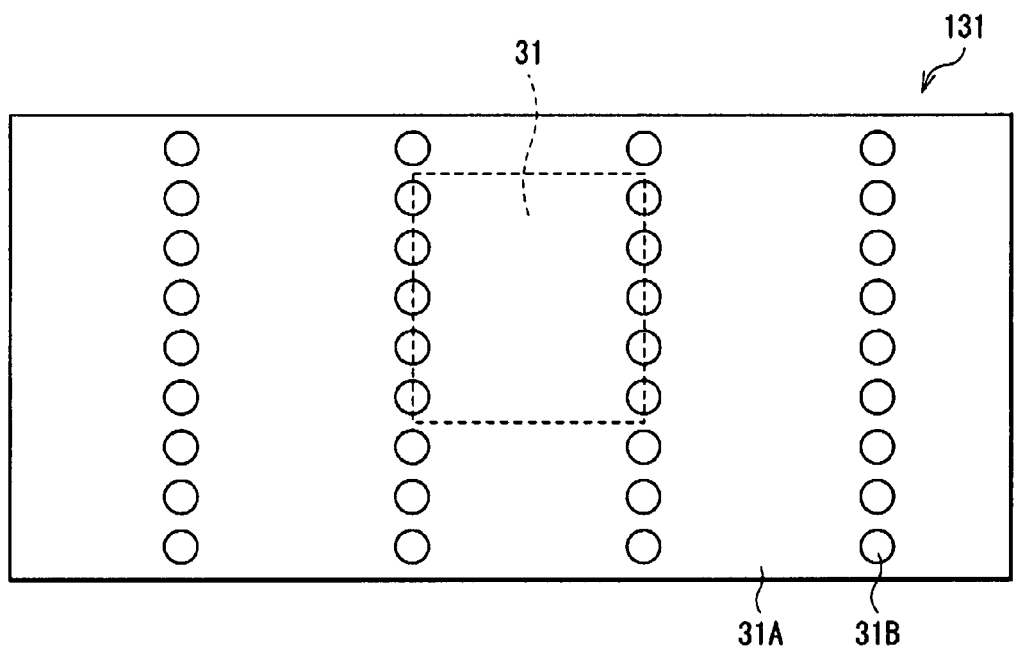
FIG. 8 is a plan structure view for explaining another example of the large GaN substrate of FIG. 7.

For example, as shown in FIG. 7 or FIG. 8, the second substrate 31 is obtained by cutting out part of a large GaN substrate 131 in which the high-defect regions 31B is regularly (periodically) arranged in the low-defect region 31A, for example, at cycles of about several hundred μm in the lateral direction. When the high-defect region 31B is in a state of a continuous strip extending in the resonator direction on the surface of the GaN substrate 131 as shown in FIG. 7, the high-defect region 31B is in the shape of a plain face penetrating the GaN substrate 131 in the resonator direction and the vertical direction. Meanwhile, when the high-defect region 31B is in a state of a discontinuous strip extending in the resonator direction on the surface of the GaN substrate 131 as shown in FIG. 8, the high-defect region 31B distributes on the GaN substrate 131 in a state of stripe in the resonator direction, and is in the shape of a stripe penetrating the GaN substrate 131 in the vertical direction. The average dislocation density in the low-defect region 31A of the GaN substrate 131 is, for example, $5 \times 10^5$ cm$^{-3}$. The average dislocation density in the high-defect region 31B is, for example, $2 \times 10^8$ cm$^{-3}$.

As described in Japanese Unexamined Patent Application Publication No. 2003-124572, the foregoing GaN substrate 131 is formed by crystal growth in a state of keeping a slant composed of a facet. By using such crystal growth method, the region with the high dislocation density can be concentrated in a given region. Further, as described above, the region with the high dislocation density and the region with the low dislocation density can be regularly and periodically formed. In the result, as will be described later, a laser structure can be formed only in the region with the low dislocation density, and thus a device with the superior light emitting characteristics can be formed.

Meanwhile, as shown in the enlarged view of FIG. 6, the semiconductor layer 32 has a high-defect region 32B in the portion corresponding to the high-defect region 31B of the second substrate 31 and a low-defect region 32A in the portion corresponding to the low-defect region 31A. Specifically, in the semiconductor layer 32, the low-defect region 32A exists in the central region in the lateral direction, and the high-defect region 32B exists in the region (region including the side face) on the both sides of the low-defect region 32A. As will be described later, the semiconductor layer 32 is formed on the second substrate 31 by epitaxial growth with the use of, for example, MOCVD (Metal Organic Chemical Vapor Deposition) method. Thereby, the crystal dislocation of the second substrate 31 is propagated to the semiconductor layer 32.

Figure 9:
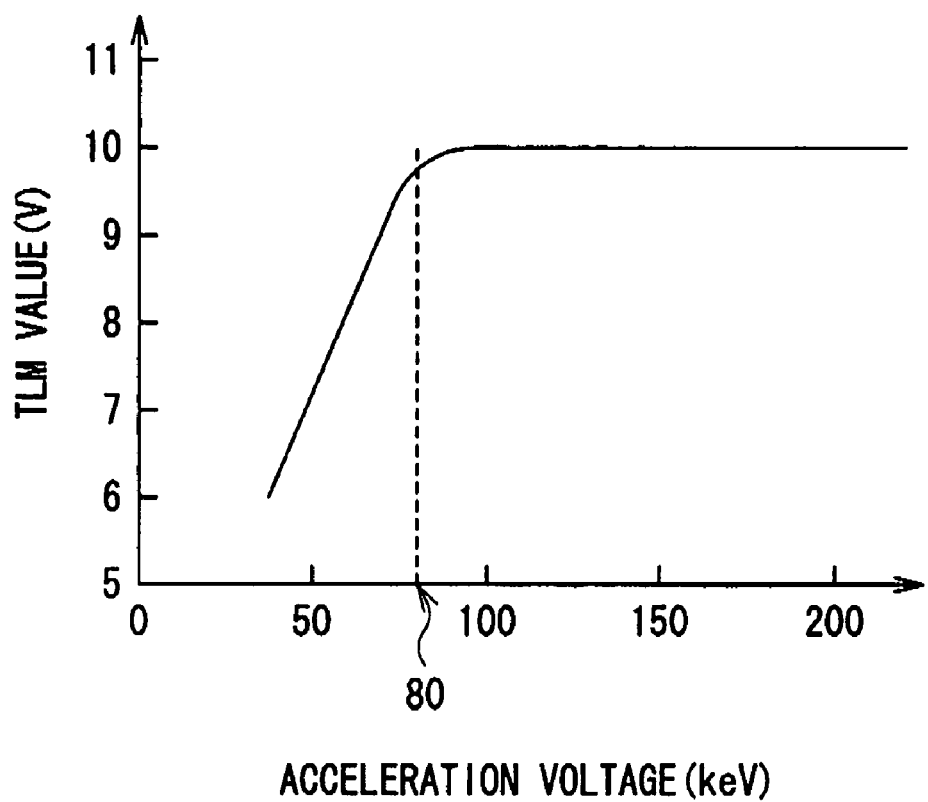
FIG. 9 is a relation diagram for explaining a relation between an acceleration voltage and a TLM value in ion implantation.

The high-defect region 32B has a high-resistance region 32B-1 on the surface of the semiconductor layer 32 and in the vicinity thereof. The high-resistance region 32B-1 is formed by, for example, ion implantation of B, N, Fe or the like onto the surface of the semiconductor layer 32 at the ion energy of 80 keV or more. As shown in FIG. 9, when the acceleration voltage applied between the terminals is 80 keV or more, the TML (transmission line method) value becomes constant, 10V. It shows that in this case, the surface of the high-defect region 32B or the vicinity thereof can be sufficiently insulated. Thereby, the high-resistance region 32B-1 prevents an event that part of an insulating layer 35 is accidentally torn when a bar 30A is processed into chips by dicing in the after-mentioned manufacturing step, and the resultant exposed portion of the high-resistance region 32B-1 and a p-side electrode 36 (described later) are short-circuited to generate a leak current and lower the light emitting intensity. In FIG. 6, the high-defect region 32B is provided on the both side faces in parallel with the resonator direction and the vicinity thereof in the surface of the semiconductor layer 32. However, the high-defect region 32B is preferably provided at least on the surface on connection pads 39, 46, and 48 side (in the vicinity of side face S3) in the surface of the semiconductor layer 32.

Otherwise, the second substrate 31 may be formed by cutting out a large GaN substrate in which the plurality of high-defect regions 31B (second region) are irregularly formed in the low-defect region 31A. GaN is a material having the high thermal conductivity of about 2 W (cm·K). When n-type GaN is used as the second substrate 31, by using such characteristics, the second substrate 31 can also function as a heat sink that diffuses heat generated in the laser diode 1.

The n-type cladding layer is made of n-type AlGaAs, for example. The active layer 33 has a multi-quantum well structure composed of a well layer and a barrier layer that are respectively formed from $Ga_{x4}In_{1-x4}N$ ($0<x4<1$) with the composition different from each other, for example. The p-type cladding layer is made of p-type AlGaN, for example. The p-side contact layer is made of p-type GaN, for example.

As shown in FIG. 2 and FIG. 6, part of the p-type cladding layer and the p-side contact layer have a stripe-shaped ridge 34 extending in the direction in parallel with the resonator direction of the first light emitting device 20. Thereby, current confinement is made. The extending direction of the ridge 34 corresponds to the resonator direction of the second light emitting device 30. The ridge 34 is formed in the low-defect region 32A of the semiconductor layer 32. In the active layer 33, a current injection region (light emitting point 33-1) is formed in the region corresponding to the ridge 34.

As shown in FIG. 2, the insulating layer 35 is formed on the continuous surface (hereinafter referred to as surface 32A) from the side face of the ridge 34 to the surface of the p-type cladding layer. Between the surface 32A and the insulating layer 35, for example, a layer for improving contact characteristics between the surface 32A and the insulating layer 35 or the like can be arranged. The insulating layer 35 has both the high thermal conductivity and the high insulative characteristics as the foregoing insulating layer 25 does. In the insulating layer 35, for example, a layer including an insulating material that has a main material such as AlN, BN, SiC, GaN, and AlGaInN and does not contain oxygen; and a layer including an insulating material such as AlNOx, BNOx, $SiO_2$, GaNOx, and AlGaInNOx are layered in this order from the surface 32A side.

Since the insulating layer 35 is provided on the surface 32A, a current flows only from the region provided with no insulating layer 35, that is, from the top face of the ridge 34 into the active layer 33. Therefore, the insulating layer 35 also has a current confinement function.

On the rear face of the second substrate 31, the n-side electrode 37 is provided. The n-side electrode 37 is electrically connected to the second substrate 31. As described above, the n-side electrode 37 is connected to the external power source with the n-side common electrode 12, the heat sink 11 and the like in between. The n-side electrode 37 has, for example, a structure in which an alloy of Au and Ge; Ni; and Au are sequentially layered from the first substrate 21 side.

The p-side electrode 36 (third electrode) is provided on the surface that continues from the top face of the ridge 34 (surface of the p-side contact layer) to the surface of the insulating layer 35. The p-side electrode 36 is electrically connected to the p-side contact layer. As shown in FIG. 2, in addition to the p-side electrode 36, a connection portion 38, the connection pad 39 (third connection pad) electrically connected to the p-side electrode 36 with the connection portion 38 in between, and an insulating layer 40 having an aperture in the region of the connection pad 39 are respectively provided on the insulating layer 35. As shown in FIG. 5, the connection pad 39 is provided in the portion that is in the vicinity of the cleavage face S3 on the main emitting side and in the vicinity of side face S5 as one of a pair of side faces oppositely arranged to each other in the direction orthogonal to the resonator direction. One end of a wire 52 is joined to the surface of the connection pad 39. The other end of the wire 52 is connected to the external power source.

The p-side electrode 36, the connection portion 38, and the connection pad 39 respectively have a multilayer structure in which, for example, Ti, Pt, and Au are layered in this order. The insulating layer 40 is made of, for example, a material similar to that of the foregoing insulating layer 35.

As shown in FIG. 3 and FIG. 5, the stripe-shaped opposed electrode 42 (first opposed electrode) welded with the welding layer 41, the stripe-shaped opposed electrode 44 (second opposed electrode) welded with the welding layer 43, a connection pad 46 (first connection pad) physically and electrically connected to the opposed electrode 42 with a connection portion 45 in between, and a connection pad 48 (second connection pad) physically and electrically connected to the opposed electrode 44 with a connection portion 47 in between are respectively provided on the surface of the insulating layer 40.

As shown in FIG. 3 and FIG. 5, the opposed electrode 42 is formed extending in the resonator direction in the central region of the chip, and is arranged in the vicinity of the cleavage face S3 side. The opposed electrode 42 is arranged oppositely to the p-side electrode 26A of the first device 20A and electrically connected to the p-side electrode 26A with the welding layer 41 in between. The opposed electrode 44 is formed adjacently to the opposed electrode 42 in the outer edge region on the opposite side of the p-side electrode 36 of the chip. The opposed electrode 44 is formed extending in the resonator direction, and is arranged in the vicinity of the cleavage face S3 side. The opposed electrode 44 is arranged oppositely to the p-side electrode 26B of the second device 20B and is electrically connected to the p-side electrode 26B with the welding layer 43 in between. FIG. 1 shows the case in which the end face on the main emitting side of the first light emitting device 20 and the cleavage face S3 on the main emitting side of the second light emitting device are arranged on the same plain face. However, this embodiment is not limited thereto. For example, the end face on the main emitting side of the first light emitting device 20 and the cleavage face S3 on the main emitting side of the second light emitting device may be arranged on a plain face different from each other.

As shown in FIG. 5, the connection pad 46 is provided in the region that is the middle region between the cleavage face S3 on the main emitting side and cleavage face S4 on the opposite side of the main emitting side, and in the vicinity of the side face S5. The connection pad 48 is provided in the region that is in the vicinity of the cleavage face S4 on the opposite side of the main emitting side and in the vicinity of the side face S5. The connection pads 46 and 48 are arranged in a line together with the connection pad 39 in the extending direction (resonator direction) of the ridge 34 of the second light emitting device 30. That is, the connection pads 39, 46, and 48 are all formed on the surface of the second light emitting device 30, are arranged side by side in a stripe-shaped region in parallel with the stripe-shaped opposed electrodes 42 and 44, and are provided between the side face S5 as one of the pair of side faces oppositely arranged in the direction orthogonal to the resonator direction and the opposed electrode 42, adjacently to the opposed electrode 42.

As shown in FIG. 5, the connection portion 45 is formed between the opposed electrode 42 and the connection pad 46. Thus, the connection portion 45 is provided in the region that is the middle region between the cleavage face S3 and the cleavage face S4, and in the vicinity of the side face S5 with the connection pad 46 in between. The connection portion 47 is formed between the opposed electrode 44 and the connection pad 48. Thus, the connection portion 47 is provided in the region that is in the vicinity of the cleavage face S4, and between the cleavage face S4 and the opposed electrodes 42 and 44.

One end of a wire 53 is joined to the surface of the connection pad 46. The other end of the wire 53 is joined to the external power source. One end of a wire 54 is joined to the surface of the connection pad 48. The other end of the wire 54 is joined to the external power source (refer to FIG. 1 and FIG. 5).

The welding layers 41 and 43 are intended to weld the opposed electrodes 42 and 44 to the p-side electrodes 26A and 26B so that the opposed electrodes 42 and 44 are electrically conducted to the p-side electrodes 26A and 26B. For example, the welding layers 41 and 43 are made of Au—Sn (gold tin) solder with the welding temperature of 250 deg C. The opposed electrodes 42 and 44, the connection portions 45 and 47, and the connection pads 46 and 48 are made of, for example, a metal thin film such as Au (gold).

On the cleavage faces S3 and S4 perpendicular to the extending direction of the ridge 34 (resonator direction), a pair of reflector films 55 and 56 (coat film, refer to FIG. 4) is formed. The reflector film 55 formed on the cleavage face S3 on the main emitting side is made of, for example, $Al_2O_3$, and is adjusted to have the low reflectance. Meanwhile, the reflector film 56 formed on the cleavage face S4 on the opposite side of the main emitting side is made of, for example, a lamination in which an aluminum oxide layer and a $TiO_2$ layer are alternately layered, and is adjusted to have the high reflectance. Thereby, light respectively generated in the light emitting region of the active layer 33 (light emitting point 33-1) travels between the pair of reflector films 55 and 56, amplified, and emitted as a beam from the reflector film 55 on the low reflectance side. It is possible that light leaked from the reflector film 56 on the high reflectance side is detected by, for example, a photo detector or the like (not shown), the detected light is converted to photocurrent, and thereby the optical power of the light emitted from the low reflectance side is measured.

A convex portion 49 is respectively provided on all or part of the region closest to the cleavage face S3 of the surface of the connection pad 39 and on all or part of the region closest to the cleavage face S4 of the surface of the connection pad 48 (refer to FIG. 1, FIG. 4, and FIG. 5).

Figure 10:
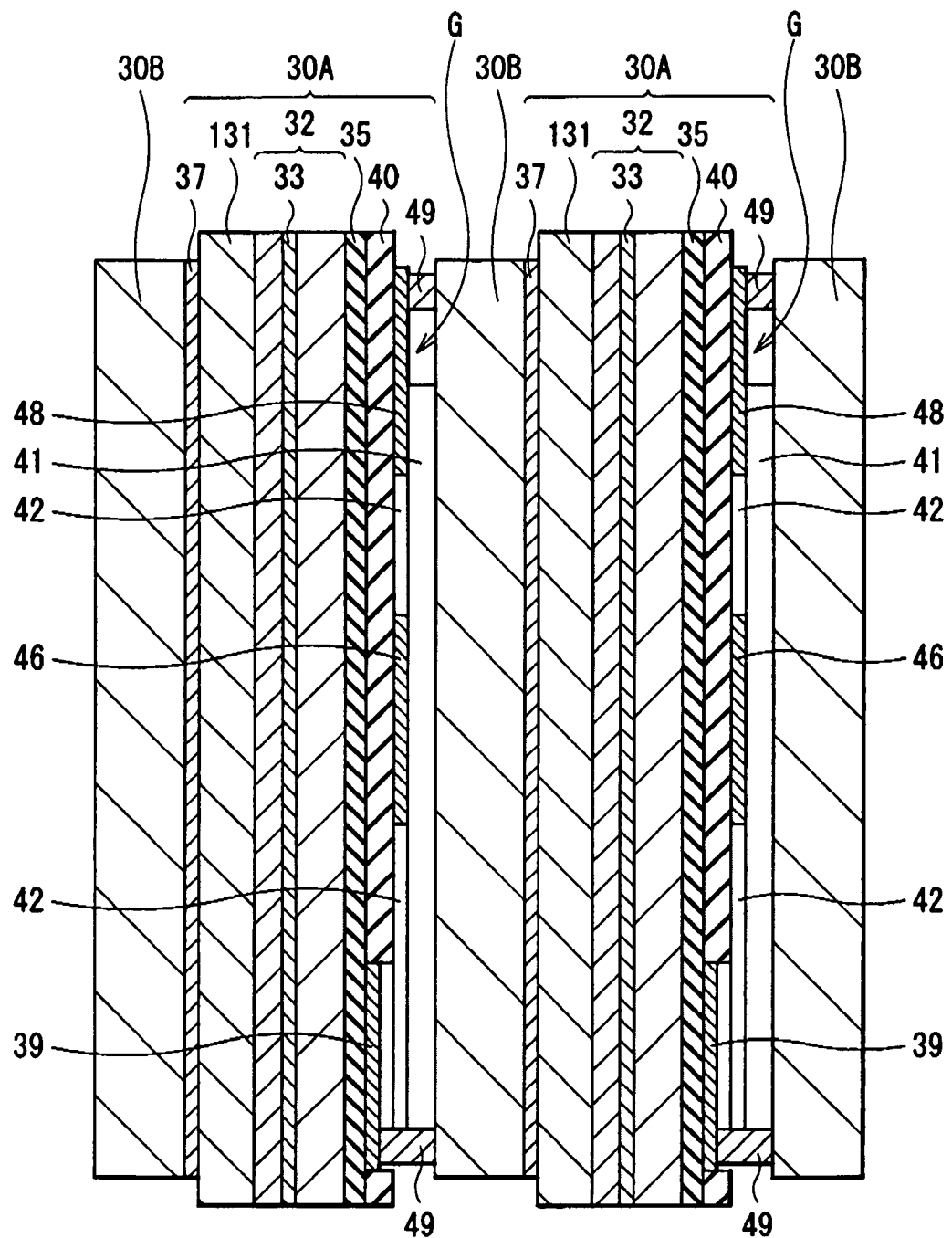
FIG. 10 is a cross section for explaining an end face coating of a second light emitting device of FIG. 1.
Figure 13:
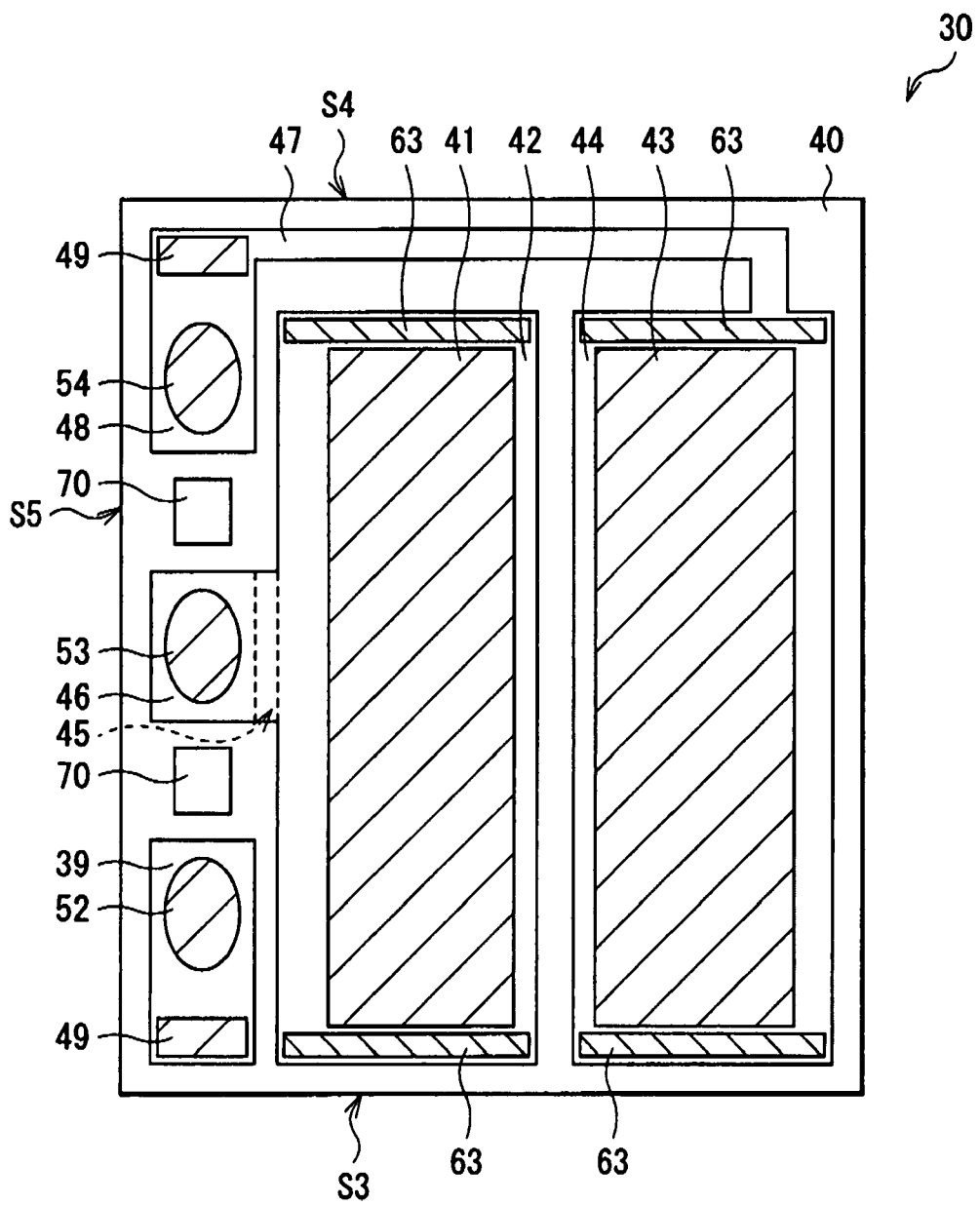
FIG. 13 is a cross sectional structure view of a second modification of the semiconductor light emitting unit of FIG. 11.

As shown in FIG. 4, each convex portion 49 is preferably formed so that the height H from the bottom face of the second substrate 31 is equal to each other. The height of the convex portion 49 is preferably almost equal to the height of the welding layers 41 and 43. For example, the convex portion 49 is made of, Au—Sn (gold tin) solder with the welding temperature of 250 deg C. As will be described later, the convex portion 49 functions as follows, when a material of the reflector films 55 and 56 is adhered by, for example, evaporation or sputtering to the cleavage faces S3 and S4 of the bar 30A in a state that the bar 30A and a dummy bar 30B are layered alternately as shown in FIG. 10 in a manufacturing step. Since the welding layers 41 and 43 formed on the surface of the opposed electrodes 42 and 44 are projected from the surface of the bar 30A, a clearance is generated between the surface of the bar 30A and the surface of the dummy bar 30B. The convex portion 49 fills in part of the clearance, and prevents a material scattered due to evaporation or sputtering from being adhered to the main portion of the connection pads 39 and 48. That is, the convex portion 49 works as a wall to the main portion of the connection pads 39 and 48, and functions to prevent the material scattered due to evaporation or sputtering from being adhered to the main portion of the connection pads. Therefore, it is preferable that the top face of the convex portion 49 on the cleavage face S3 side and the top face of the convex portion 49 on the cleavage face S4 side are in plane with the top face of the welding layers 41 and 43 as shown in FIG. 13, or it is preferable the both heights of the convex portions 49 are adjusted so that the top face of the convex portion 49 on the cleavage face S3 side and the top face of the convex portion 49 on the cleavage face S4 side are higher than the top face of the welding layers 41 and 43 on the basis of the bottom face of the second substrate 31.

The position of the convex portion 49 is not limited to the foregoing position. For example, the convex portion 49 may be provided between the connection pad 39 and the cleavage face S3, or between the connection pad 48 and the cleavage face S4.

As shown in FIG. 1 and FIG. 5, for example, a mark 70 is provided between the connection pad 39 and the connection pad 46, and between the connection pad 46 and the connection pad 48 of the surface of the insulating layer 35. The mark 70 is a marker for detecting the position of the second light emitting device 30 in the direction orthogonal to the resonator direction. The mark 70 is used for layering the first light emitting device 20 on the second light emitting device 30 in a manufacturing step. The mark 70 may be arranged to sandwich the connection pads 39, 46, and 48 in the parallel direction. In this case, the connection pads 39, 46, and 48 can be located apart from the cleavage faces S3 and S4, and thereby leak fault can be prevented from being generated in the high-defect region 32B in the vicinity of the cleavage faces S3 and S4.

The mark 70 may be made of an independent island-like metal film that is not contacted with a conductive member such as the opposed electrode 42 as shown in FIG. 1 and FIG. 5. Otherwise, the mark 70 may be provided to be contacted with the conductive member such as the opposed electrode 42. The mark 70 is made of a material similar to that of the opposed electrode 42 and the like. The mark 70 may be formed in block together with the opposed electrode 42 and the like at a time in a manufacturing step.

The semiconductor light emitting unit having the foregoing structure can be manufactured as below, for example.

First, the first light emitting device 20 as one of the components of the laser diode 1 is formed. The semiconductor layer 22A is formed by, for example, MOCVD method. As a raw material of the GaP Group III-V compound semiconductor, for example, TMA (trimethyl aluminum), TMG (trimethyl gallium), TMIn (trimethyl indium), or $PH_3$ (phosphine) is used.

Specifically, the n-side contact layer, the n-type cladding layer, the active layer 23A, the p-type cladding layer, and the p-type contact layer are layered in this order on a large substrate GaP substrate to form the semiconductor layer 22A. Subsequently, in the semiconductor layer 22A, the p-side contact layer and the p-type cladding layer are provided with patterning by, for example, dry etching method so that a narrow stripe-shaped convex portion is obtained to form a plurality of ridges 24A in parallel with each other at the given intervals.

Next, the semiconductor layer 22B is formed by a method similar to the foregoing method. As a raw material of the GaAs Group III-V compound semiconductor, for example, TMA, TMG, TMIn, and $AsH_3$ (arsine) is used.

Specifically, on the portion where the ridge 24A is not formed in the surface of the GaP substrate, the n-side contact layer, the n-type cladding layer, the active layer 23B, the p-type cladding layer, and the p-side contact layer are layered in this order to form the semiconductor layer 22B. Subsequently, in the semiconductor layer 22B, the p-side contact layer and the p-type cladding layer are provided with patterning by, for example, dry etching method so that a narrow stripe-shaped convex portion is obtained to form the ridge 24B between the ridges 24A.

Next, an insulating material that contains a main material such as AlN, BN, SiC, GaN, and AlGaInN and does not contain oxygen (for example, AlN) is formed on the top face of the ridges 24A and 24B and on the surface A by evaporation or sputtering. After that, the resultant surface is oxidized by, for example, exposing the surface in moisture vapor or the like. Thereby, an oxide such as AlNOx is formed on the surface, and the insulating layer 25 is formed.

Next, in the insulating layer 25, the region corresponding to the top face of the ridges 24A and 24B (surface of the contact layer) is removed by etching. After that, the p-side electrode 26A is formed on the continuous surface from the surface of the p-side contact layer of the ridge 24A to part of the surface of the insulating layer 25. The p-side electrode 26B is formed on the continuous surface from the surface of the p-side contact layer of the ridge 24B to part of the surface of the insulating layer 25.

Next, the GaP substrate is cleaved to form a bar 20A on which the ridges 24A and 24B are alternately arranged in parallel with each other. After that, the pair of reflector films 55 and 56 is formed on the cleavage faces S1 and S2. Subsequently, the bar 20A is die-cut for every pair of ridges 24A and 24B to obtain a chip. Thereby, the first light emitting device 20 is formed.

Next, the second light emitting device 30 is formed. The semiconductor layer 32 is formed by, for example, MOCVD method. As a raw material of the nitrogen Group III-V compound semiconductor, for example, TMA (trimethyl aluminum), TMG (trimethyl gallium), TMIn (trimethyl indium), or ammonium ($NH_3$) is used.

Specifically, the n-side contact layer, the n-type cladding layer, the active layer 33, the p-type cladding layer, and the p-side contact layer are layered in this order on the GaN substrate 131 (refer to FIG. 7 and FIG. 8) to form the semiconductor layer 32. Subsequently, in the semiconductor layer 32, the p-side contact layer and the p-type cladding layer are provided with patterning by, for example, dry etching method so that a narrow stripe-shaped convex portion is obtained to form each ridge 34 for every low-defect region 32A, and the respective ridges 34 are formed in parallel with each other.

Next, ion implantation of B, N, Fe or the like is made onto the surface of the high-defect region 32B included in the GaN substrate 131 at the ion energy of 80 keV or more. Thereby, the high-resistance region 32B-1 is formed on the surface of the high-defect region 32B and in the vicinity thereof. After that, the insulating layer 35 is formed on the top face of the ridge 34 and the surface B with the use of a method similar to the method of forming the insulating layer 25.

Next, in the insulating layer 35, the region corresponding to the top face of the ridge 34 (surface of the contact layer) is removed by etching. After that, the p-side electrode 36, the connection portion 38, and the connection pad 39 are formed at a time on the continuous surface from the surface of the p-side contact layer of the ridge 34 to part of the surface of the insulating layer 35.

Next, the insulating layer 40 having an aperture in the region of the connection pad 39 is formed. After that, the opposed electrodes 42 and 44, the connection portions 45 and 47, the connection pads 46 and 48, and the mark 70 are formed at a time on the insulating layer 40.

Next, the welding layers 41 and 43 are formed on the surface of the opposed electrodes 42 and 44. The convex portion 49 is formed on all or part of the region closest to the cleavage face S3 of the surface of the connection pad 39 and on all or part of the region closest to the cleavage face S4 of the surface of the connection pad 48. When the material of the welding layers 41 and 43 is identical with the material of the convex portion 49, the welding layers 41 and 43 and the convex portion 49 are preferably formed at a time.

Next, the GaN substrate 131 is cleaved to form the bar 30A on which the plurality of ridges 34 are arranged in parallel with each other. After that, the pair of reflector films 55 and 56 is formed on the cleavage faces S3 and S4 formed by cleaving the substrate.

Specifically, as shown in FIG. 10 (cross section cutting across the connection pads 39, 46, and 48), the bar 30A in which the plurality of ridges 34 are arranged in parallel with each other on the GaN substrate 131 and the flat dummy bar 30B are layered alternately. In this state, for example, $Al_2O_3$ is adhered to the cleavage face S3 of the bar 30A by evaporation or sputtering. Meanwhile, in this state, for example, aluminum oxide and $TiO_2$ are adhered in this order to the cleavage face S4 by evaporation or sputtering. Thereby, the pair of reflector films 55 and 56 is formed on the cleavage faces S3 and S4. A material scattered due to evaporation or sputtering is scattered onto the surface of the bar 30A through clearance G, but hardly scattered onto the rear side of the convex portion 49. Therefore, an unnecessary film is not adhered to the main portion of the connection pads 39 and 48 provided on the rear side of the convex portion 49.

Next, the bar 30A is die-cut between each ridge 34 to obtain a chip. Thereby, the second light emitting device 30 is formed.

Next, the first light emitting device 20 with the semiconductor layers 22A and 22B side downward (with the semiconductor layers 22A and 22B side facing to the second light emitting device 30 side) is joined to the surface on the semiconductor layer 33 side of the second light emitting device 30, so that the resonator direction and the light emitting direction become equal to each other. Consequently, the laser diode 1 of this embodiment is formed.

Next, the second light emitting device 30 of the laser diode 1 is joined to the submount 10 with the welding layer 13 in between. After that, the rear face of the submount is fixed on the heat sink 11 by the welding layer 14 (refer to FIG. 2). Finally, by bonding the wires 50 to 54, the semiconductor light emitting unit of this embodiment is manufactured.

In the semiconductor light emitting unit of this embodiment, when a given voltage is applied between the connection pad 39 electrically connected to the p-side electrode 36 and the heat sink 11 electrically connected to the n-side electrode 37, a current is injected into the active layer 33, and light emission is generated due to electron-hole recombination. Then, laser light in the wavelength of about 400 nm (for example, 405 nm) is emitted from the light emitting point 33-1 of the second light emitting device 30 in the lamination in-plane direction. When a given voltage is applied between the connection pad 46 electrically connected to the p-side electrode 26A and the heat sink 11 electrically connected to the n-side electrode 27, a current is injected into the active layer 33A, and light emission is generated due to electron-hole recombination. Then, laser light in 600 nm band (for example, 650 nm) is emitted from the light emitting point 33A-1 of the first device 20A. When a given voltage is applied between the connection pad 48 electrically connected to the p-side electrode 26B and the heat sink 11 electrically connected to the n-side electrode 27, a current is injected into the active layer 33B, and light emission is generated due to electron-hole recombination. Then, laser light in 700 nm band (for example, 780 nm) is emitted from the light emitting point 33B-1 of the second device 20B. As above, in the semiconductor light emitting unit of this embodiment, the second light emitting device 30, the first device 20A, and the second device 20B can independently emit laser light in the wavelength different from each other.

Then, in the laser diode 1, Joule heat is generated due to the high current density. The heat generated in the second light emitting device 30 is dissipated to the heat sink 11 side. Meanwhile, the heat generated in the first light emitting device 20 is dissipated to the second light emitting device 30 side through the ridges 24A-1 and 24B-1, and the insulating layers 25 and 35.

In this embodiment, the second light emitting device 30 having the semiconductor layer 32 formed from the nitrogen Group III-V compound semiconductor with the high heat release characteristics is provided in contact with the first light emitting device 20. Therefore, the heat of the first light emitting device 20 can be sufficiently diffused through the second light emitting device 30 and the heat sink 11. As just described, in the laser diode 1, the heat generated in the first light emitting device 20 and the second light emitting device 30 can be effectively diffused. Therefore, the heat resistance is lowered, and the heat release characteristics can be improved. Consequently, the characteristics and the reliability of the laser diode 1 can be improved.

In this embodiment, the connection pads 39, 46, and 48 that are respectively and electrically connected to the p-side electrodes 26A, 26B, and 36 separately supplying a current to the respective ridges 24A, 24B, and 34 are all formed on the surface of the second light emitting device 30 (surface on the opposite side of the heat sink 11); are arranged in parallel with the stripe-shaped opposed electrodes 42 and 44; and are provided between the side S5 as one of the pair of side faces oppositely arranged to each other in the direction orthogonal to the resonator direction and the opposed electrode 42, adjacently to the opposed electrode 42 (refer to FIG. 1, FIG. 2, and FIG. 5). Thereby, even when the second light emitting device 30 is formed slightly large for the purpose of securing heat release characteristics of the laser diode 1 itself, an unused space of the surface of the second light emitting device 30 can be filled with the connection pads 39, 46, and 48. Therefore, an unused space created depending on the layout of the connection pads 39, 46, and 48 can be minimized. As described above, by devising the layout of the connection pads 39, 46, and 48, the laser diode 1 can be downsized while securing the heat release characteristics.

In this embodiment, the convex portion 49 is formed on all or part of the region closest to the cleavage face S3 in the surface of the connection pad 39 and on all or part of the region closest to the cleavage face S4 in the surface of the connection pad 48 (refer to FIG. 1 and FIG. 5). Thereby, when a material of the reflector films 55 and 56 is adhered by, for example, evaporation or sputtering to the cleavage faces S3 and S4 of the bar 30A in a state that the bar 30A and the dummy bar 30B are layered alternately as shown in FIG. 13 in the foregoing manufacturing step, part of the clearance G (clearance between the connection pads 39, 48 and the cleavage faces S3, S4) between the surface of the bar 30A and the surface of the dummy bar 30B can be filled with the convex portion 49, since the welding layers 41 and 43 formed on the surface of the opposed electrodes 42 and 44 are protruded from the surface of the bar 30A. Therefore, an unnecessary film can be prevented from being formed on the main portion of the connection pads 39 and 48. In the result, a space for bonding the wires 52 and 54 to the connection pads 39 and 48 can be surely secured. Thus, in the subsequent manufacturing step, there is no possibility that the wires 52 and 54 are not able to be bonded to the connection pads 39 and 48 since a material scattered due to evaporation or sputtering is adhered to the main portion of the connection pads 39 and 48. Consequently, compared to the case that the convex portion 49 is not provided, the yield is improved.

Second Embodiment

Figure 11:
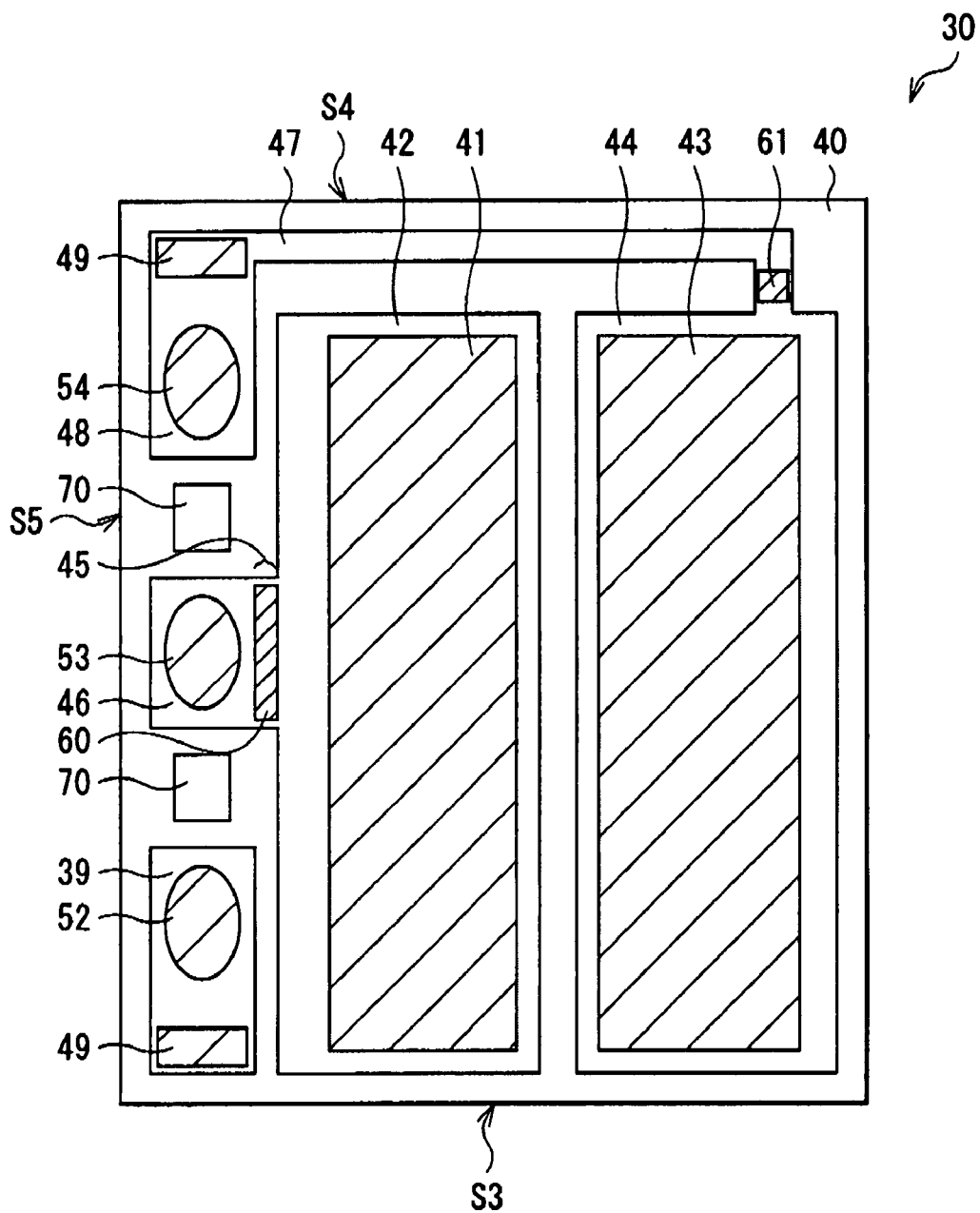
FIG. 11 is a cross sectional structure view corresponding to the view taken along arrows D-D of a semiconductor light emitting unit of a second embodiment.

FIG. 11 shows a cross portion of a laser diode unit according to a second embodiment of the invention. The cross section is taken along a line corresponding to line D-D of FIG. 2 in the foregoing first embodiment.

The structure of this laser diode unit is different from that of the foregoing first embodiment in respect that this laser diode unit includes a convex portion 60 on the connection portion 45 and a convex portion 61 on the connection portion 47, respectively. Thus, descriptions will be hereinafter mainly given of differences to the foregoing first embodiment, and the descriptions of the structure, the operation, and the effect similar to those of the first embodiment will be omitted as appropriate.

The convex portion 60 (61) is a projecting structure made of a material with the poor wetting characteristics equal to or lower than those of the connection portion 45 (47) (for example, when the connection portion 45 (47) is made of Au, the convex portion 60 (61) is made of Au, Pt, Ni, Si, Ti or Al). "Wetting characteristics" is related to interfacial tension between a solid and a liquid. "Poor wetting characteristics" mean a state that when a liquid is dropped onto a solid, the contact angle between the dropped liquid and the solid surface is small, and the solid surface seems to repel the liquid. On the contrary, "good wetting characteristics" mean a state that the contact angle between the dropped liquid and the solid surface is large, and the solid surface seems to be soaked with the liquid.

Thereby, in a manufacturing step, when the welding layer 41 (43) formed on the opposed electrode 42 (44) is fused to connect the opposed electrode 42 (44) to the p-side electrode 26A (26B), the convex portion 60 (61) can prevent the welding layer 41 (43) from flowing onto the connection portion 45 (47) to cover the entire main portion of the connection pads 46 and 48 or part thereof.

The convex portion 60 (61) is preferably formed in the place where the convex portion itself does not block the light path of light emitted from the first light emitting device 20. Further, the convex portion 60 (61) is preferably formed in the place where the convex portion 60 (61) does not block the light path of light emitted from the first light emitting device 20 until the welding layer 41 (43) flowing onto the connection portion 45 (47) reaches the convex portion 60 (61).

In the result, a space for bonding the wires 53 and 54 to the connection pads 46 and 48 can be surely secured. Thus, in the subsequent steps, there is no possibility that the wires 53 and 54 are not able to be bonded to the connection pads 46 and 48 due to the flowing welding layer 41 (43). Consequently, compared to the case that the convex portion 60 (61) is not provided, the yield is improved.

Modifications of the Second Embodiment

Descriptions will be hereinafter given of various modifications of the foregoing second embodiment. The descriptions will be hereinafter mainly given of differences to the foregoing second embodiment, and the descriptions of the structure, the operation and the effect similar to those of the second embodiment will be omitted as appropriate.

First Modification

Figure 12:
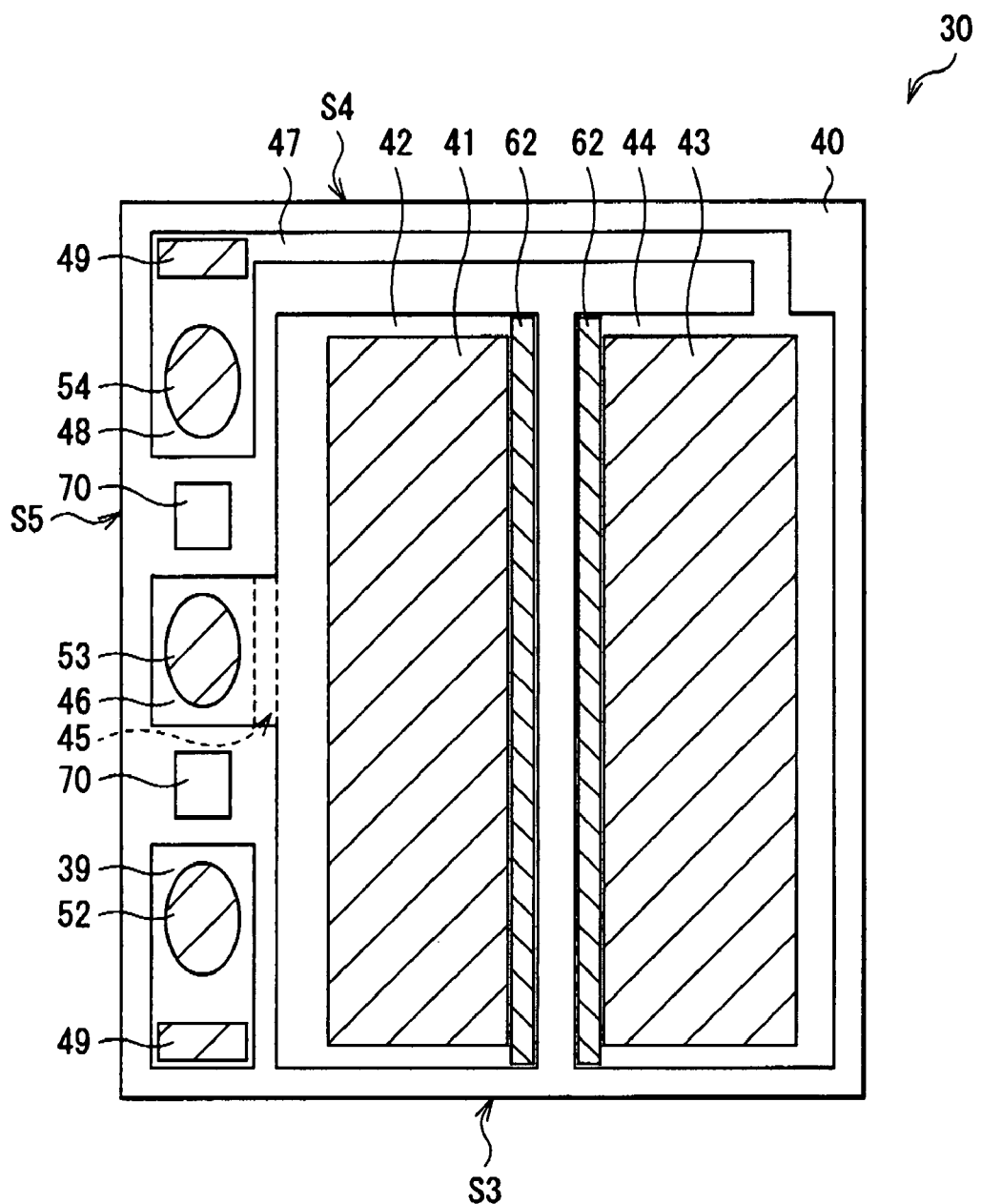
FIG. 12 is a cross sectional structure view of a first modification of the semiconductor light emitting unit of FIG. 11.

FIG. 12 shows a cross sectional structure of a laser diode unit according to a first modification of the foregoing second embodiment. The cross section is taken along a line corresponding to line D-D of FIG. 2 in the foregoing first embodiment. The structure of this laser diode unit is different from that of the foregoing second embodiment in respect that this laser diode unit includes a convex portion 62 between the welding layer 41 and the welding layer 43.

The convex portion 62 is formed in at least one of the end on the opposed electrode 44 side of the opposed electrode 42 and the end on the opposed electrode 42 side of the opposed electrode 44. In FIG. 12, the case that the convex portion 62 is formed in both the end on the opposed electrode 44 side of the opposed electrode 42 and the end on the opposed electrode 42 side of the opposed electrode 44 is shown. In the manner similar to the convex portion 60 of the foregoing second embodiment, the convex portion 62 is a projecting structure made of a material with the poor wetting characteristics equal to or lower than those of the opposed electrodes 42 and 44.

Thereby, in a manufacturing step, when the welding layer 41 (43) is fused to connect the opposed electrode 42 (44) to the p-side electrode 26A (26B), the convex portion 62 can prevent the welding layer 41 (43) from flowing between the opposed electrode 42 and the opposed electrode 44, resulting in short circuit between the welding layer 41 and the welding layer 43. In the result, in the subsequent steps, there is no possibility that short circuit between the welding layer 41 and the welding layer 43 is caused by flowing welding layer 41 (43). Consequently, compared to the case that the convex portion 62 is not provided, the yield is improved.

Second Modification

FIG. 13 shows a cross sectional structure of a laser diode unit according to a second modification of the foregoing second embodiment. The cross section is taken along a line corresponding to line D-D of FIG. 2 in the foregoing first embodiment. The structure of this laser diode unit is different from that of the second embodiment in respect that this laser diode unit includes a convex portion 63 on the ends of the cleavage face S3 side and the cleavage face S4 side of the opposed electrodes 42 and 44.

In the manner similar to the convex portion 60 of the foregoing second embodiment, the convex portion 63 is a projecting structure made of a material with the poor wetting characteristics equal to or lower than those of the opposed electrodes 42 and 44.

Thereby, in a manufacturing step, when the welding layer 41 (43) is fused to connect the opposed electrode 42 (44) to the p-side electrode 26A (26B), the convex portion 63 can prevent the welding layer 41 (43) from flowing to the cleavage faces S3 and S4, resulting in short circuit between the respective layers composing the semiconductor layer 33. In the result, in the subsequent steps, there is no possibility that short circuit between the respective layers composing the semiconductor layer 33 is caused by the welding layers 41 (43) flowing to the cleavage faces S3 and S4. Consequently, compared to the case that the convex portion 63 is not provided, the yield is improved.

Third Modification

Figure 14:
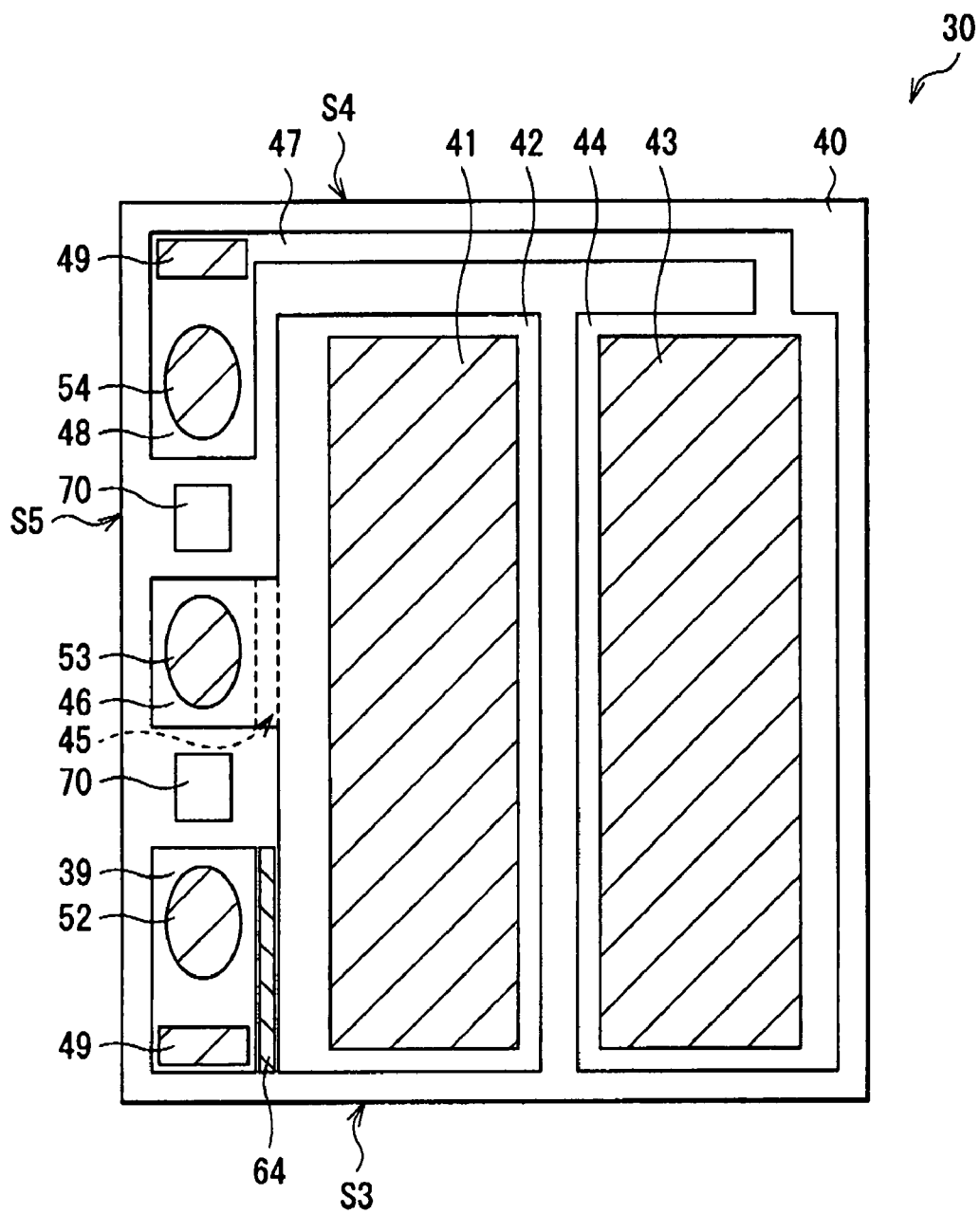
FIG. 14 is a cross sectional structure view of a third modification of the semiconductor light emitting unit of FIG. 11.

FIG. 14 shows a cross sectional structure of a laser diode unit according to a third modification of the foregoing second embodiment. The cross section is taken along a line corresponding to line D-D of FIG. 2 in the foregoing first embodiment. The structure of this laser diode unit is different from that of the second embodiment in respect that this laser diode unit includes a convex portion 64 between the connection pad 39 and the opposed electrode 42.

In the manner similar to the convex portion 60 of the foregoing second embodiment, the convex portion 64 is a projecting structure made of a material with the poor wetting characteristics equal to or lower than that of the connection pad 39.

Thereby, in a manufacturing step, when the welding layer 41 (43) is fused to connect the opposed electrode 42 (44) to the p-side electrode 26A (26B), the convex portion 64 can prevent the welding layer 41 from flowing to the connection pad 39 and covering the main portion of the connection pad 39. In the result, in the subsequent steps, there is no possibility that the welding layer 41 flows to the connection pad 39 and covers the main portion of the connection pad 39. Consequently, compared to the case that the convex portion 64 is not provided, the yield is improved.

Fourth Modification

Figure 15:
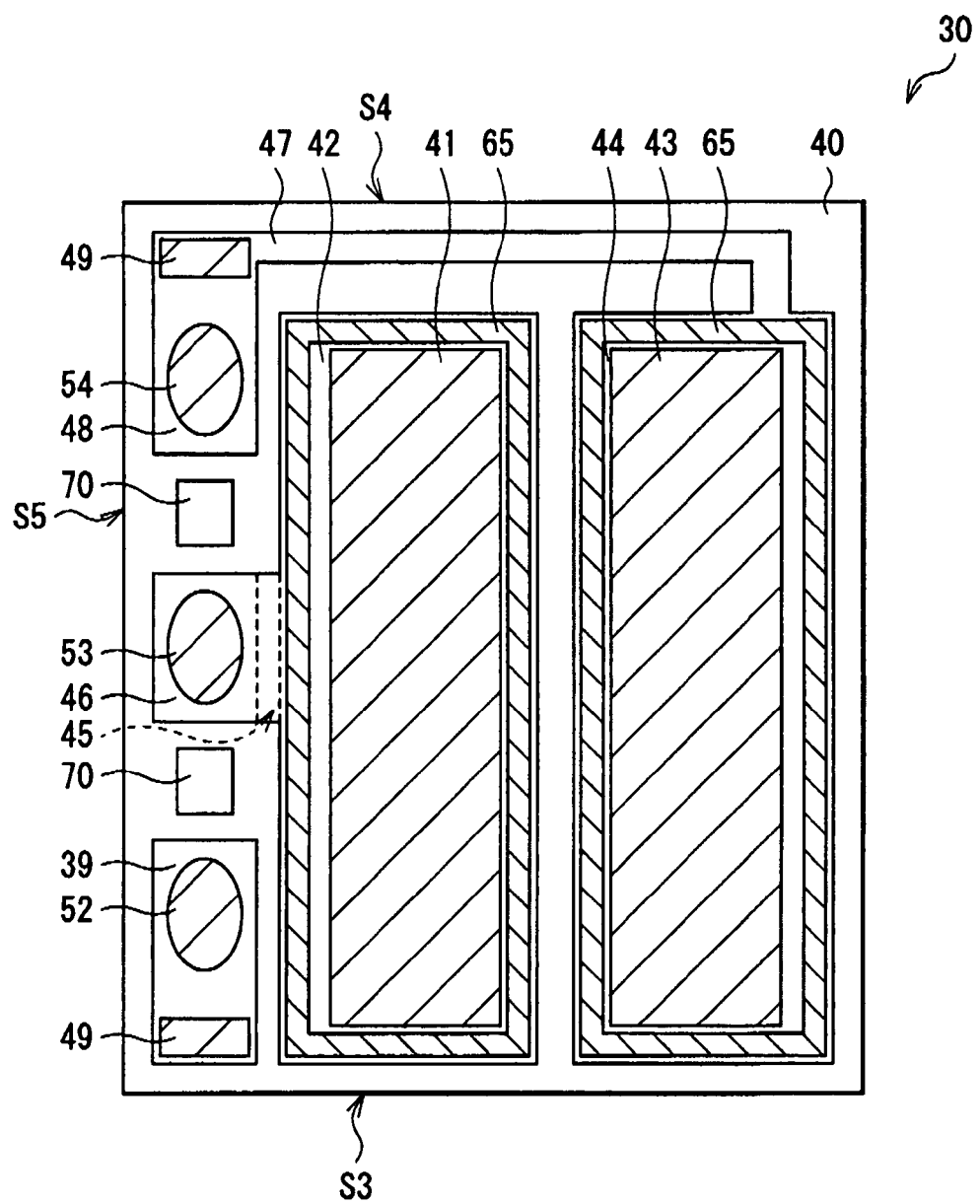
FIG. 15 is a cross sectional structure view of a fourth modification of the semiconductor light emitting unit of FIG. 11.

FIG. 15 shows a cross sectional structure of a laser diode unit according to a fourth modification of the foregoing second embodiment. The cross section is taken along a line corresponding to line D-D of FIG. 2 in the foregoing first embodiment. The structure of this laser diode unit is different from that of the second embodiment in respect that this laser diode unit includes a convex portion 65 that surrounds the welding layer 41 (43) from the in-plane direction on the opposed electrode 42 (44).

In the manner similar to the convex portion 60 of the foregoing second embodiment, the convex portion 65 is a projecting structure made of a material with the poor wetting characteristics equal to or lower than those of the opposed electrode 42 (44).

Thereby, in a manufacturing step, when the welding layer 41 (43) is fused to connect the opposed electrode 42 (44) to the p-side electrode 26A (26B), the convex portion 65 can prevent the welding layer 41 (43) from flowing from the opposed electrode 42 (44) and covering the entire main portion of the connection pads 39, 46, and 48 or part thereof. In addition, the convex portion 65 can prevent short circuit between the welding layer 41 and the welding layer 43, or short circuit between the respective layers composing the semiconductor layer 33. In the result, in the subsequent steps, there is no possibility that the welding layer 41 (43) flows to the cleavage faces S3 and S4, resulting in the foregoing respective shortcomings. Consequently, compared to the case that the convex portion 65 is not provided, the yield is improved.

Third Embodiment

Figure 18:
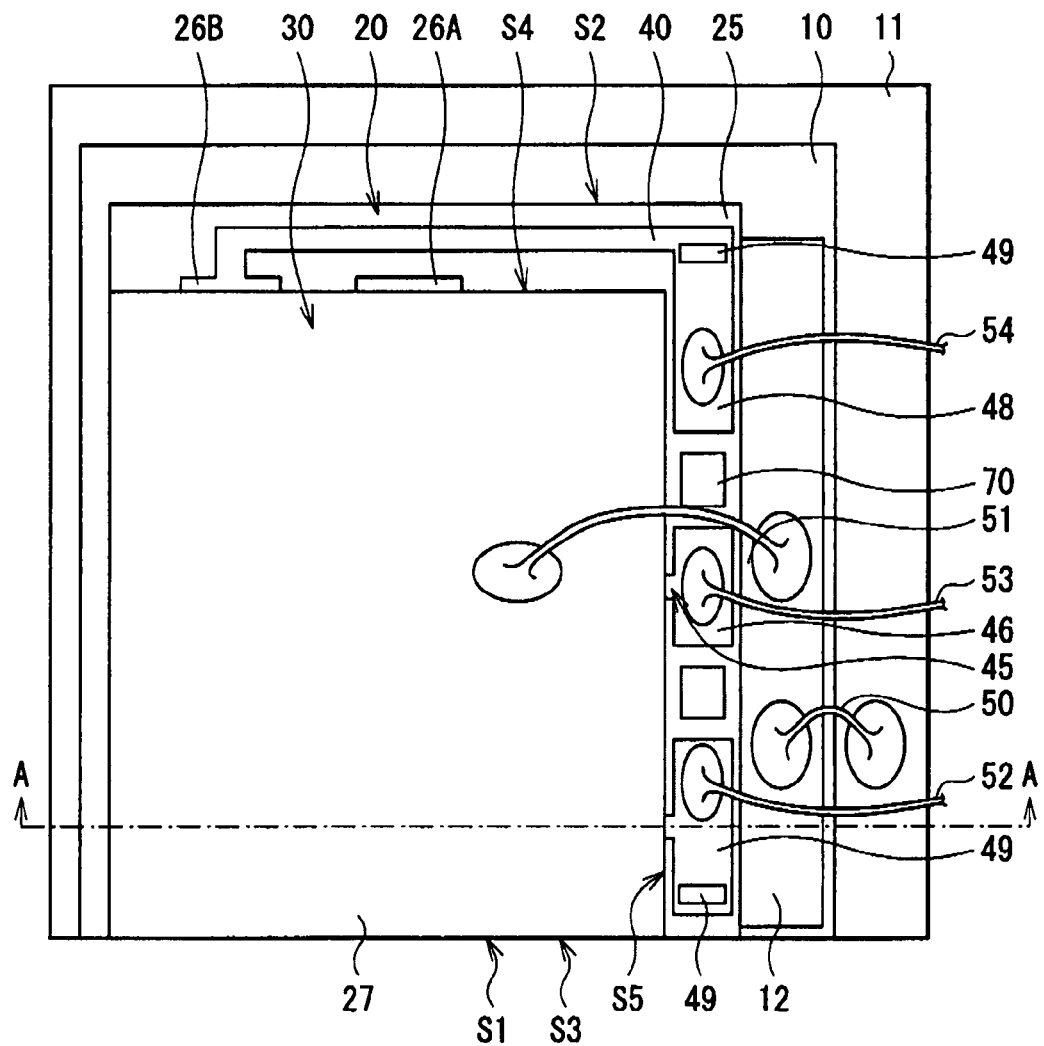
FIG. 18 is a top structure view of a semiconductor light emitting unit according to a third embodiment of the invention.
Figure 19:
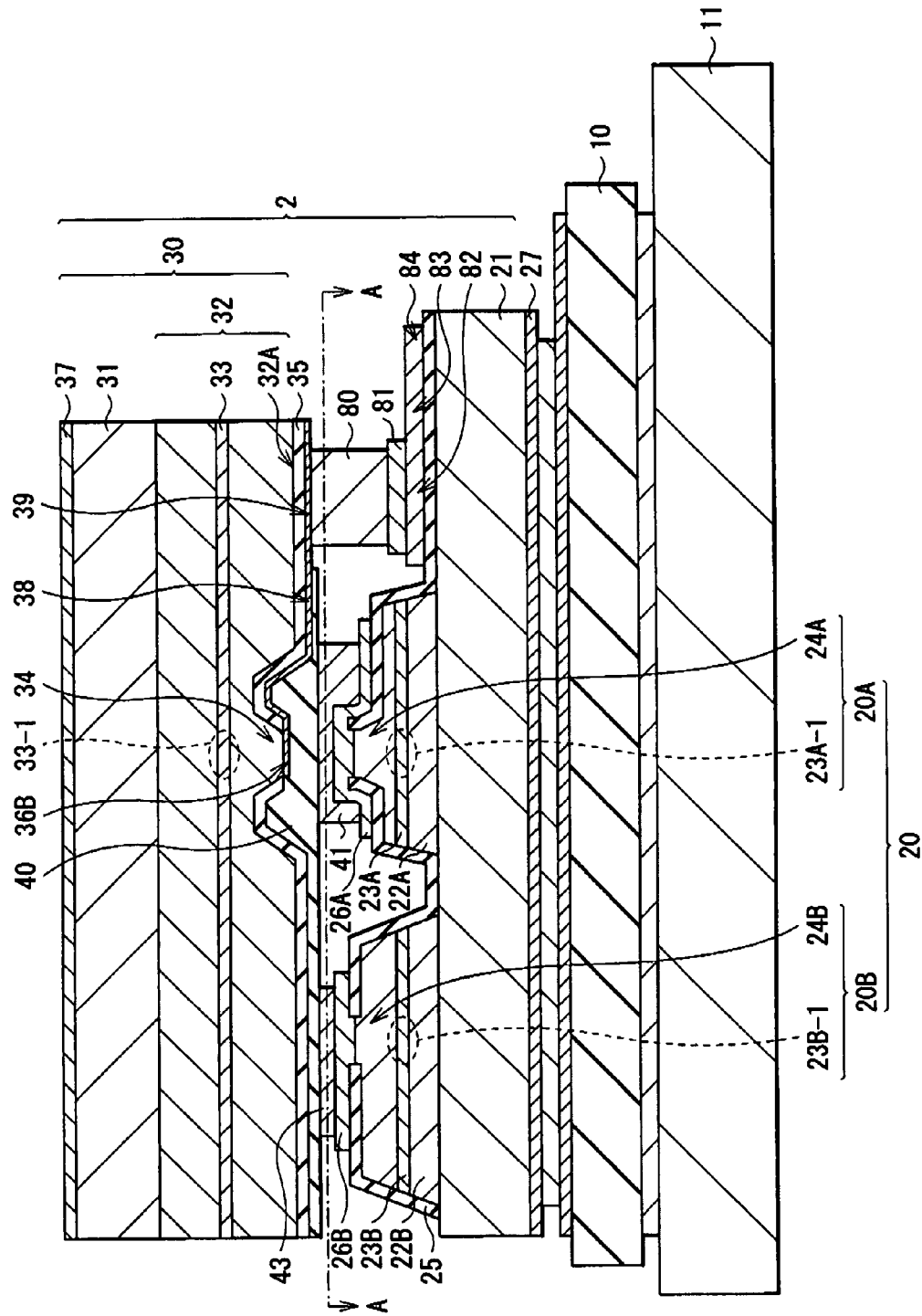
FIG. 19 is a cross sectional structure view taken along arrows A-A of the semiconductor light emitting unit of FIG. 18.
Figure 20:
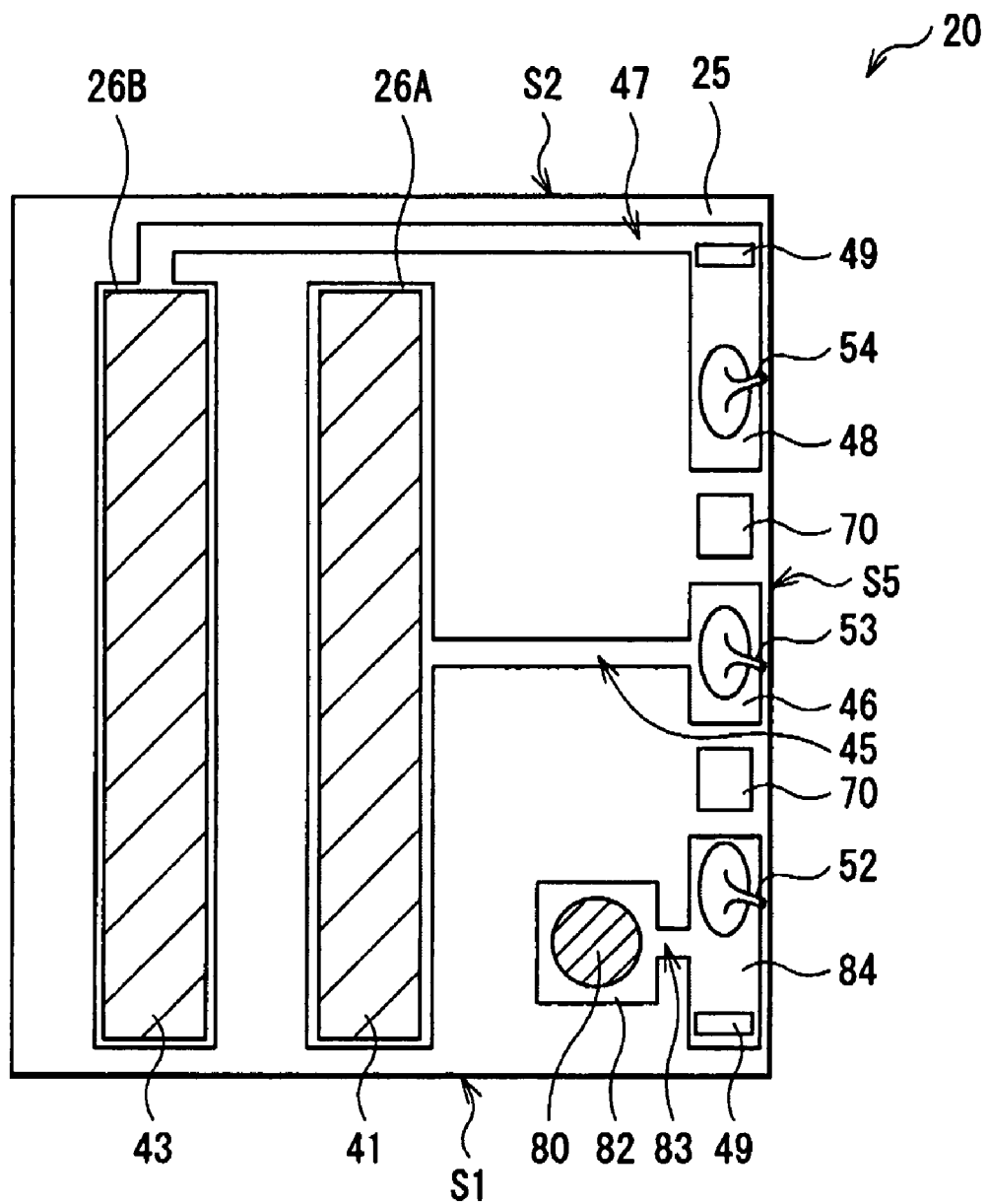
FIG. 20 is a cross sectional structure view taken along arrows A-A of the semiconductor light emitting unit of FIG. 19.

FIG. 18 shows a top structure view of a laser diode unit according to a third embodiment of the invention, FIG. 19 shows a cross sectional structure taken along arrows A-A of the laser diode unit of FIG. 18 and FIG. 20 shows a cross sectional structure view taken along arrows A-A of the laser diode unit of FIG. 19. As shown in FIG. 18, in the laser diode unit, a laser diode 2 is joined to a submount 10 as a support member, and a heat sink 11 as a heat release member is joined to the rear face of the submount 10. FIG. 18 to FIG. 20 schematically show the laser diode unit, and the dimensions and the shapes are different from those used actually.

The laser diode 2 in the third embodiment is different in structure from the laser diode 1 in the first embodiment and the second embodiment in the way that, in the laser diode 2, as shown in FIG. 19, a chip-shaped first light emitting device 20 and a second light emitting device 30 are layered in this order on the submount 10, while in the first embodiment and the second embodiment, in the laser diode 1, the chip-shaped second light emitting device 30 and the first light emitting device 20 are layered in this order on the submount 10. Thus, descriptions will be hereinafter mainly given of differences to the foregoing first embodiment and the second embodiment, and the common points with the first embodiment and the second embodiment will be omitted as appropriate.

Further, in the laser diode 2, the second light emitting device 30 is inverted (with the substrate side upward) and then is layered on the first light emitting device 20, so that a light emitting point 23A-1 of a first device 20B is close to a light emitting point 33-1 of the second light emitting device 30 as much as possible. The method of layering the first light emitting device 20 and the second light emitting device 30 is not limited thereto. For example, the first light emitting device 20 may be layered on the second light emitting device 30 so that a light emitting point 23B-1 of the first light emitting device 20 and the light emitting point 33-1 of the second light emitting device 30 are approximate to each other. Otherwise, the first light emitting device 20 may be layered on the second light emitting device 30 so that the midpoint between the light emitting point 23A-1 and the light emitting point 23B-1 of the first light emitting device 20 is approximate to the light emitting point 33-1 of the second light emitting device 30.

Between the laser diode 2 and the submount 10, a welding layer 13 for joining the laser diode 2 to the submount 10 is provided (refer to FIG. 19).

First Light Emitting Device 20

As shown in FIG. 19, a p-side electrode 26A (a first electrode) formed on a ridge 24A of a first device 20A is joined to an insulating layer 40 by a welding layer 41, and a p-side electrode 26B (a second electrode) formed on a ridge 24B of the second device 20B is joined to the insulating layer 40 by a welding layer 43.

Second Light Emitting Device 30

As shown in FIG. 19, on the surface of a connection pad 39, formed is a bump 80 joined to an opposed electrode 82 (described later) by a welding layer 81 which is provided on the end face opposite to the connection pad 39 of the bump 80. The bump 80 is also electrically connected to the opposed electrode 82, a connection section 83 (described later) and a connection pad 84 (described later).

The bump 80 is, for example, made of metal blocks such as Au. The opposed electrode 82, the connection section 83 and the connection pad 84 are, for example, made of metal thin film such as Au. The welding layer 81 is intended to weld the bump 80 and the opposed electrode 82 so that the bump 80 is electrically conducted to the opposed electrode 82. The welding layer 81 is made of, for example, Au—Sn (gold tin) solder with the welding temperature of 250 deg C.

In the third embodiment, as shown in FIG. 18 to FIG. 20, on an insulating layer 25 of the first light emitting device 20, the stripe-shaped p-side electrode 26A welded with the welding layer 41, a connection pad 46 physically and electrically connected to the p-side electrode 26A with a connection portion 45 in between, the stripe-shaped p-side electrode 26B welded with the welding layer 43, the connection pad 48 physically and electrically connected to the p-side electrode 26B with a connection portion 47 in between, the opposed electrode 82 welded with the welding layer 81 and the connection pad 84 physically and electrically connected to the opposed electrode 82 with the connection portion 83 in between.

As shown in FIG. 20, the p-side electrode 26B is formed extending in the resonator direction in the central region of the chip, and is arranged in the vicinity of a cleavage face S1 side. The p-side electrode 26B is electrically connected to the first device 20A with the welding layer 43 in between. The p-side electrode 26A is formed adjacently to the p-side electrode 26B. The p-side electrode 26A is formed extending in the resonator direction, and is arranged in the vicinity of the cleavage face S1 side. The p-side electrode 26A is electrically connected to the second device 20B with the welding layer 41 in between.

As shown in FIG. 18 and FIG. 20, the connection pad 46 is provided in the region that is in the middle region between the cleavage face S1 on the main emitting side and a cleavage face S2 on the opposite side of the main emitting side, and in the vicinity of a side face S5. The connection pad 48 is provided in the region that is in the vicinity of the cleavage face S2 on the opposite side of the main emitting side and in the vicinity of the side face S5. The connection pads 46 and 48 are arranged in a line together with the connection pad 84 in the extending direction (resonator direction) of the ridge 24A of the first light emitting device 20. That is, the connection pads 46, 48 and 84 are all formed on the surface of the first light emitting device 20, are arranged side by side in a stripe-shaped region in parallel with the stripe-shaped p-side electrode 26A, and are provided between the side face S5 as one of the pair of side faces oppositely arranged in the direction orthogonal to the resonator direction and the p-side electrode 26A, adjacently to the p-side electrode 26A.

Convex portions 49 are respectively provided on all or part of the region closest to the cleavage face S1 of the surface of the connection pad 84 and on all or part of the region closest to the cleavage face S2 of the surface of the connection pad 48 (refer to FIG. 18 and FIG. 20).

Each convex portion 49 is preferably formed so that the height from the bottom face of the first substrate 21 is equal to each other. The height of the convex portion 49 is preferably almost equal to the height of the welding layers 41 and 43. The convex portion 49 functions as follows, when a material of reflector films is adhered by, for example, evaporation or sputtering to the cleavage faces S1 and S2 of the bar-shaped first substrate 21 to be separated into chips, in a state that the bar-shaped first substrate 21 to be separated into chips and a dummy bar are layered alternately in a manufacturing step. The welding layers 41 and 43 formed on the surface of the p-side electrodes 26A and 26B fill in part of a clearance between the bar-shaped first substrate 21 to be separated into chips and the dummy bar, and prevent a material scattered due to evaporation or sputtering from being adhered to the main portion of the connection pads 48 and 84. That is, the convex portion 49 works as a wall to the main portion of the connection pads 48 and 84, and functions to prevent the material scattered due to evaporation or sputtering from being adhered to the main portion of the connection pads 48 and 84. Therefore, it is preferable that the top face of the convex portion 49 on the cleavage face S1 side and the top face of the convex portion 49 on the cleavage face S2 side are in plane with the top face of the welding layers 41 and 43, or it is preferable the both heights of the convex portions 49 are adjusted so that the top face of the convex portion 49 on the cleavage face S1 side and the top face of the convex portion 49 on the cleavage face S2 side are higher than the top face of the welding layers 41 and 43 on the basis of the bottom face of the first substrate 21.

The position of the convex portion 49 is not limited to the foregoing position. For example, the convex portion 49 may be provided between the connection pad 84 and the cleavage face S1, or between the connection pad 48 and the cleavage face S2.

As shown in FIG. 18 and FIG. 20, for example, a mark 70 is provided between the connection pad 84 and the connection pad 46, and between the connection pad 46 and the connection pad 48 of the surface of the insulating layer 25. The mark 70 is a marker for detecting the position of the first light emitting device 20 in the direction orthogonal to the resonator direction. The mark 70 is used for layering the first light emitting device 20 on the second light emitting device 30 in a manufacturing step. The mark 70 may be arranged to sandwich the connection pads 46, 48, and 84 in the parallel direction.

The mark 70 may be made of an independent island-like metal film that is not contacted with a conductive member such as the p-side electrode 26A as shown in FIG. 18 and FIG. 20. Otherwise, the mark 70 may be provided to be contacted with the conductive member such as the p-side electrode 26A. The mark 70 is made of a material similar to that of the p-side electrode 26A and the like. The mark 70 may be formed at a time together with the p-side electrode 26A and the like in a manufacturing step.

In the semiconductor light emitting unit of this embodiment, when a given voltage is applied between the connection pad 84 electrically connected to the p-side electrode 36 and the heat sink 11 electrically connected to a n-side electrode 37, current is injected into an active layer 33, and light emission is generated due to electron-hole recombination. Then, laser light in the wavelength of about 400 nm (for example, 405 nm) is emitted from the light emitting point 33-1 of the second light emitting device 30 in the lamination in-plane direction. When a given voltage is applied between the connection pad 46 electrically connected to the p-side electrode 26A and the heat sink 11 electrically connected to the n-side electrode 27, current is injected into the active layer 33A, and light emission is generated due to electron-hole recombination. Then, laser light in 600 nm band (for example, 650 nm) is emitted from the light emitting point 33A-1 of the first device 20A. When a given voltage is applied between the connection pad 48 electrically connected to the p-side electrode 26B and the heat sink 11 electrically connected to the n-side electrode 27, current is injected into the active layer 33B, and light emission is generated due to electron-hole recombination. Then, laser light in 700 nm band (for example, 780 nm) is emitted from the light emitting point 33B-1 of the second device 20B. As above, in the semiconductor light emitting unit of this embodiment, the second light emitting device 30, the first device 20A, and the second device 20B can independently emit laser light in the wavelength different from each other.

Then, in the laser diode 2, Joule heat is generated due to the high current density. In this embodiment, the second light emitting device 30 having the semiconductor layer 32 formed from the nitrogen Group III-V compound semiconductor with the high heat release characteristics is provided in contact with one of the first light emitting device 20, and the heat sink 11 is provided in contact with the other of the first light emitting device 20 with the submount 10 in between. Therefore, the heat of the first light emitting device 20 can be sufficiently diffused through the second light emitting device 30 and the heat sink 11. As just described, in the laser diode 2, the heat generated in the first light emitting device 20 and the second light emitting device 30 can be effectively diffused. Therefore, the heat resistance is lowered, and the heat release characteristics can be improved. Consequently, the characteristics and the reliability of the laser diode 2 can be improved.

In this embodiment, the connection pads 46, 48, and 84 that are respectively and electrically connected to the p-side electrodes 26A, 26B, and 36 separately supplying current to the respective ridges 24A, 24B, and 34 are all formed on the surface of the first light emitting device 20 (surface on the opposite side of the heat sink 11); are arranged in parallel with the stripe-shaped p-side electrode 26A; and are provided between the side S5 as one of the pair of side faces oppositely arranged to each other in the direction orthogonal to the resonator direction and the p-side electrode 26A, adjacently to the p-side electrode 26A (refer to FIG. 19 and FIG. 20). Thereby, even when the first light emitting device 20 is formed slightly large, an unused space of the surface of the first light emitting device 20 can be filled with the connection pads 46, 48, and 84. Therefore, an unused space created depending on the layout of the connection pads 46, 48, and 84 can be minimized. As described above, by devising the layout of the connection pads 46, 48, and 84, the laser diode 2 can be downsized while securing the heat release characteristics.

In this embodiment, the convex portion 49 is formed on all or part of the region closest to the cleavage face S1 in the surface of the connection pad 84 and on all or part of the region closest to the cleavage face S2 in the surface of the connection pad 48 (refer to FIG. 18 and FIG. 20). Thereby, when a material of the reflector films is adhered by, for example, evaporation or sputtering to the cleavage faces S1 and S2 of the bar-shaped first substrate 21 to be separated into chips, in a state that the bar-shaped first substrate 21 to be separated into chips and the dummy bar are layered alternately in the foregoing manufacturing step, the convex portion 49 fill in part of the clearance (clearance between the connection pads 84, 48 and the cleavage faces S1, S2) between the bar-shaped first substrate 21 to be separated into chips and the dummy bar so that the welding layers 41 and 43 formed on the surface of the p-side electrode 26A and 26B can prevent an unnecessary film that is formed on the main portion of the connection pads 84 and 48. In the result, a space for bonding the wires 52 and 54 to the connection pads 84 and 48 can be surely secured. Thus, in the subsequent manufacturing step, there is no possibility that the wires 52 and 54 are not able to be bonded to the connection pads 84 and 48 since a material scattered due to evaporation or sputtering is adhered to the main portion of the connection pads 84 and 48. Consequently, compared to the case that the convex portion 49 is not provided, the yield is improved.

Similarly to the second embodiment and the modification thereof, convex portions 61 to 65 may be provided instead of the convex portion 49.

Application Example

The semiconductor light emitting unit LD according to the first to the third embodiments and the modifications thereof described above can be applied to various devices such as an information reproduction unit for reproducing information recorded in a recording medium (optical disk), an information recording unit for recording information onto a recording medium, an information recording/reproduction unit having the foregoing both functions, and a communication device. A description will be hereinafter given of an example thereof.

Figure 21:
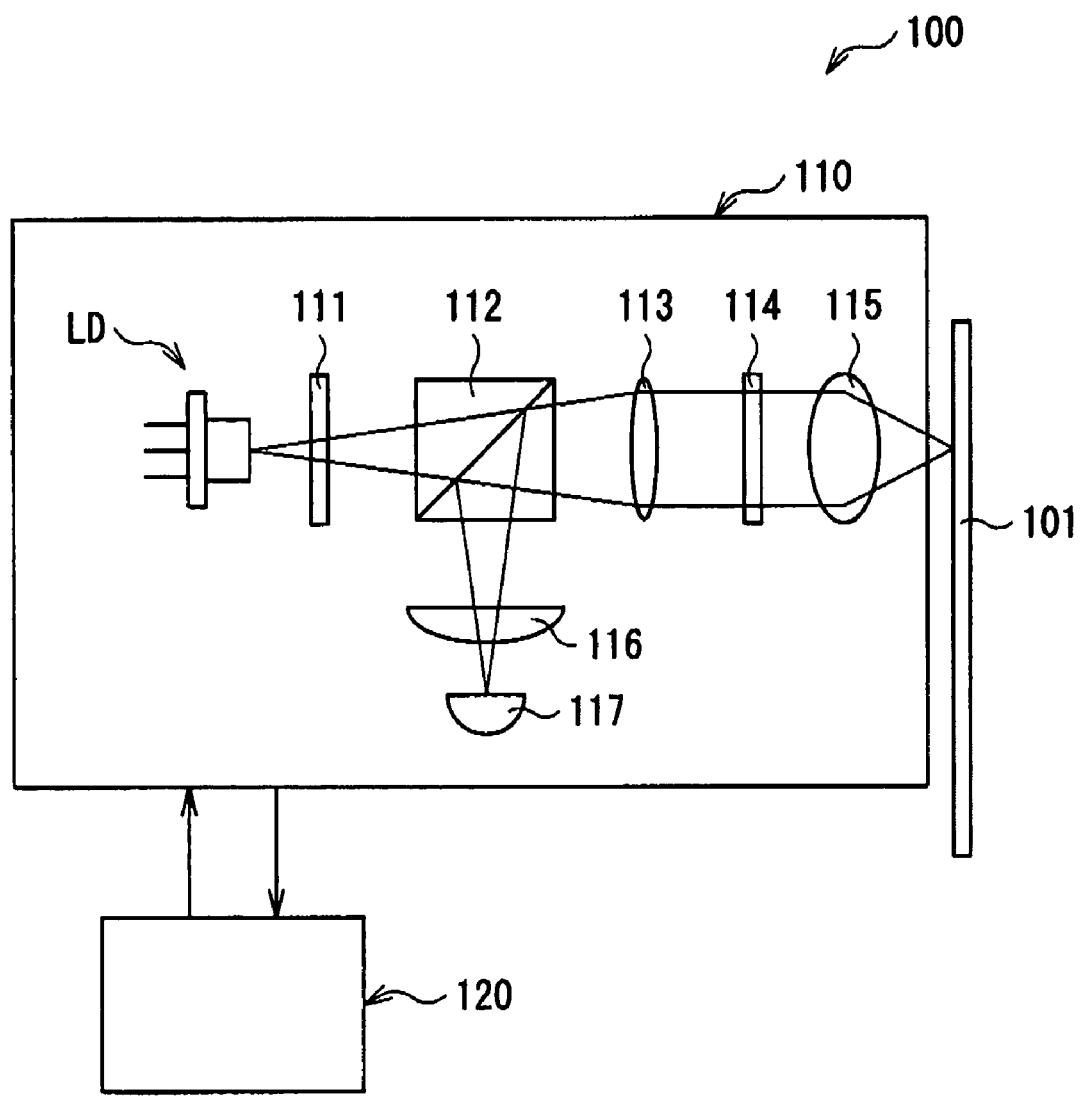
FIG. 21 is a schematic structural view of an information recording/reproduction apparatus mounting the semiconductor light emitting unit.

FIG. 21 shows one example of a schematic structure of an information recording/reproduction unit 100 according to the application example. The information recording/reproduction unit 100 includes an optical unit 110 and an information processing section 120.

The information processing section 120 acquires information recorded in a recording medium 101 from the optical unit 110, and sends inputted information to the optical unit 110. Meanwhile, the optical unit 100 is used as an optical pickup unit for high density recording and reproduction by, for example, a DVD or the like. The optical unit 100 includes a semiconductor light emitting unit LD as a light source and an optical system provided between a region mounted with the recording medium 101 such as a DVD and the semiconductor light emitting unit LD. On the surface of the recording medium 101, for example, lots of pits (projections) sized several μm are formed. The optical system is arranged in the light path from the semiconductor light emitting unit LD to the recording medium 101. For example, the optical system has a grating (GRT) 111, a polarizing beam splitter (PBS) 112, a collimation lens (CL) 113, a quarter-wave plate (λ/4 plate) 114, and an object lens (OL) 115. In addition, the optical system has a cylindrical lens (CyL) 116 and a light receiving device 117 such as a photodiode (PD) on the light path separated by the polarizing beam splitter (PBS) 112.

In the optical unit 100, light from the light source (semiconductor light emitting unit LD) passes through the GRT 111, the PBS 112, the CL 113, the λ/4 plate 114, and the OL 115, focuses on the recording medium 101, and is reflected by the pits on the surface of the recording medium 101. The reflected light passes through the OL 115, the λ/4 plate 114, the CL 113, the PBS 112, and the CyL 116 to enter the PD 117. Then, a pit signal, a tracking signal, and a focus signal are read.

As above, in the optical unit 100 in this embodiment, the semiconductor light emitting unit LD is used as a light source. Therefore, the temperature characteristics and the reliability are high, and stable usage is enabled in a wide temperature range. Further, the degree of freedom of designing the optical system can be widened.

While descriptions have been hereinbefore given of the invention with reference to the embodiments and the modifications, the invention is not limited to the foregoing embodiments, and various modifications may be made.

For example, in the foregoing embodiments, descriptions have been given with reference to the gallium arsenic (GaAs) Group III-V compound laser diode or the indium phosphorous (InP) Group III-V compound laser diode as the first light emitting device 20 and the nitrogen Group III-V compound laser diode as the second light emitting device 30; and with the examples for the compositions and the structures thereof. However, the invention can be similarly applied to a laser diode having other composition or other structure.

Further, though in the first and second embodiments, the convex portion 49 is formed on the second light emitting device 30 side, the convex portion 49 may be formed on the first light emitting device 20 side. In this case, the convex portion 49 is preferably formed on the surface between the region closest to the reflector films 55 and 56 out of the first connection pads 39, 46, and 48 and the reflector films 55 and 56. Further, the height of the convex portion 49 is preferably almost equal to the height of the welding layers 41 and 43 of the second light emitting device 30. When the convex portion 49 is formed on the first light emitting device 20 side as above, the following application is available. That is, when the cleavage faces S1 and S2 of the second light emitting device 30 are coated with the reflector films 55 and 56, the first light emitting device 20 is layered on the surface of the first connection pads 39, 46, and 48 side of the second light emitting device 30 with the convex portion 49 side of the first light emitting device 20 facing to the surface of the first connection pads 39, 46, and 48 side, and thereby the first light emitting device 20 is used instead of the dummy bar 30B. Though in the third embodiment, the convex portion 49 is formed on the first light emitting device 20 side, the convex portion 49 may be formed on the second light emitting device 30 side.

Further, in the second embodiment and the modifications thereof, the welding layer 41 (43) is respectively provided on the opposed electrode 42 (44). However, when one of the opposed electrodes 42 and 44 is sufficiently large in relation to the welding layer 41 (43), and there is no possibility that the welding layer 41 (43) flows from the opposed electrode 42 (44) in a given direction even if the foregoing convex portions 61 to 65 are not provided, the foregoing convex portions 61 to 65 are not necessarily provided for the foregoing direction in which there is no possibility that the welding layer 41 (43) flows.

Figure 16:
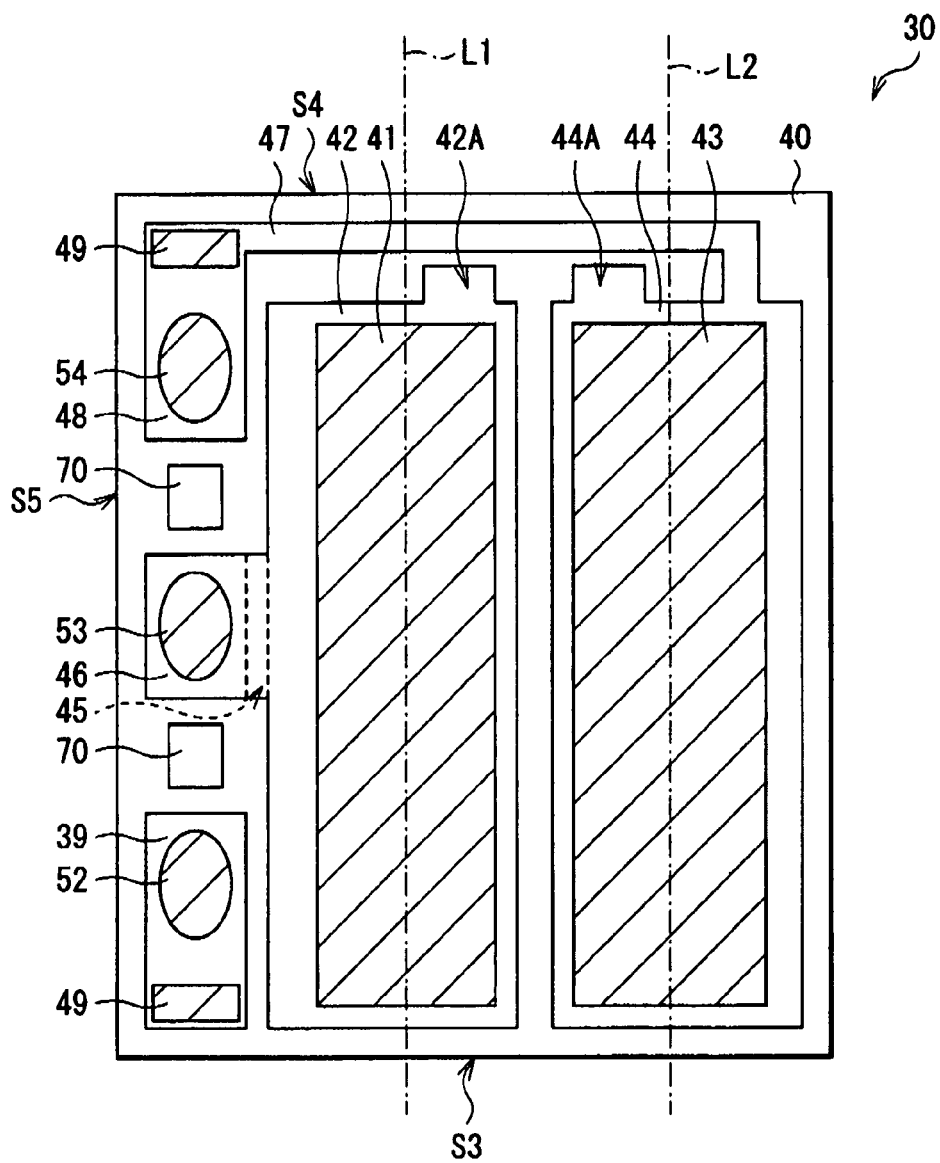
FIG. 16 is a cross sectional structure view of a modification of the semiconductor light emitting unit of FIG. 1.
Figure 17:
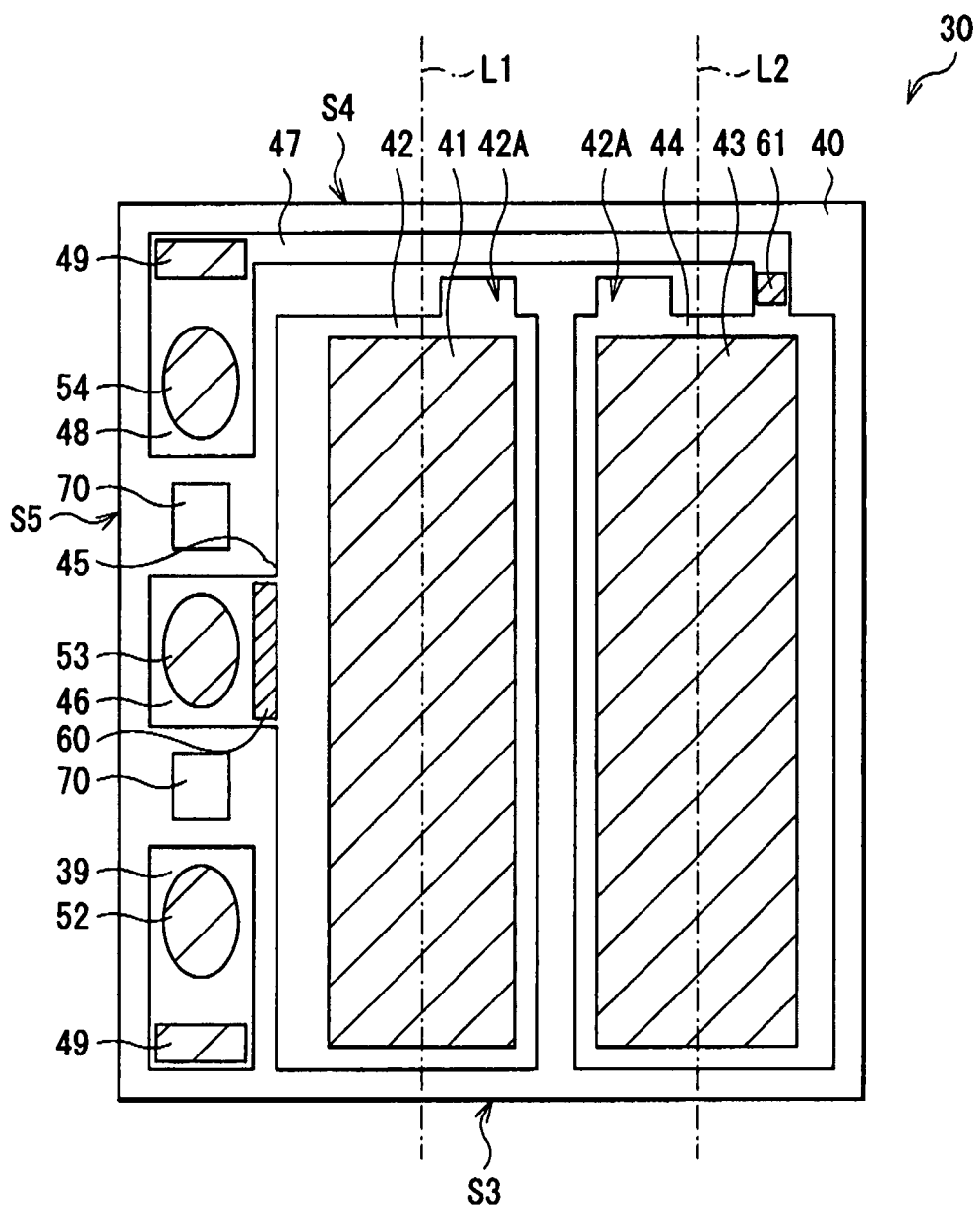
FIG. 17 is a cross sectional structure view of a modification of the semiconductor light emitting unit of FIG. 11.

Further, in the second embodiment and the modifications thereof, to prevent the welding layer 41 (43) from flowing from the opposed electrode 42 (44), the convex portions 61 to 65 are provided. However, as shown in FIG. 16, an extending portion 42A (44A) may be provided instead of the convex portions 61 to 65. Otherwise, as shown in FIG. 17, the extending portion 42A (44A) may be provided together with the convex portions 61 to 65. The extending portion 42A (44A) is provided as part of the opposed electrode 42 (44), and is provided to extend in the in-plane direction in the region not facing to the light paths L1 and L2 of light emitted from the first light emitting device 20 of the surface of the second light emitting device 30. Thereby, when the welding layer 41 (43) is fused to connect the opposed electrode 42 (44) to the p-side electrode 26A (26B), the welding layer 41 (43) can be evacuated to the extending portion 42A (44A). Therefore, it is possible to prevent the welding layer 41 (43) from flowing from the opposed electrode 42 (44) resulting in the foregoing various shortcomings.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor light emitting device formed by layering a first light emitting device and a second light emitting device, wherein:
   the first light emitting device includes
   a stripe-shaped first light emitting device section and a stripe-shaped second light emitting device section that are formed in parallel with each other on a first substrate, and
   a stripe-shaped first electrode and a stripe-shaped second electrode that separately supply current to the first light emitting device section and the second light emitting device section;
   the second light emitting device includes
   a stripe-shaped third light emitting device section formed on an opposed face side of a second substrate arranged oppositely to the first substrate,
   a stripe-shaped third electrode that supplies current to the third light emitting device section,
   a stripe-shaped first opposed electrode and a stripe-shaped second opposed electrode that are respectively arranged oppositely to the first electrode and the second electrode, and are respectively and electrically connected to the first electrode and the second electrode,
   a first connection pad and a second connection pad that are respectively and electrically connected to the first opposed electrode and the second opposed electrode,
   a third connection pad electrically connected to the third electrode; and
   the first connection pad, the second connection pad, and the third connection pad are respectively arranged on the first opposed electrode side and the second opposed electrode side of the second light emitting device and
   wherein the first connection pad, the second connection pad, and the third connection pad are arranged side by side in a stripe-shaped region in parallel with the first opposed electrode and the second opposed electrode.

2. A semiconductor light emitting device formed by layering a first light emitting device and a second light emitting device, wherein:
   the first light emitting device includes
   a stripe-shaped first light emitting device section and a stripe-shaped second light emitting device section that are formed in parallel with each other on a first substrate, and
   a stripe-shaped first electrode and a stripe-shaped second electrode that separately supply current to the first light emitting device section and the second light emitting device section;
   the second light emitting device includes
   a stripe-shaped third light emitting device section formed on an opposed face side of a second substrate arranged oppositely to the first substrate,
   a stripe-shaped third electrode that supplies current to the third light emitting device section,
   a stripe-shaped first opposed electrode and a stripe-shaped second opposed electrode that are respectively arranged oppositely to the first electrode and the second electrode, and are respectively and electrically connected to the first electrode and the second electrode,
   a first connection pad and a second connection pad that are respectively and electrically connected to the first opposed electrode and the second opposed electrode,
   a third connection pad electrically connected to the third electrode; and
   the first connection pad, the second connection pad, and the third connection pad are respectively arranged on the first opposed electrode side and the second opposed electrode side of the second light emitting device and, wherein the second light emitting device has an insulating film on a surface including the third electrode, and
   the first opposed electrode, the second opposed electrode, the first connection pad, and the second connection pad are formed on the insulating film.

3. The semiconductor light emitting device according to claim 2, wherein the insulating film has an aperture in a portion opposed to the third connection pad.

4. A semiconductor light emitting device formed by layering a first light emitting device and a second light emitting device, wherein:
   the first light emitting device includes
   a stripe-shaped first light emitting device section and a stripe-shaped second light emitting device section that are formed in parallel with each other on a first substrate, and
   a stripe-shaped first electrode and a stripe-shaped second electrode that separately supply current to the first light emitting device section and the second light emitting device section;
   the second light emitting device includes
   a stripe-shaped third light emitting device section formed on an opposed face side of a second substrate arranged oppositely to the first substrate,
   a stripe-shaped third electrode that supplies current to the third light emitting device section,
   a stripe-shaped first opposed electrode and a stripe-shaped second opposed electrode that are respectively arranged oppositely to the first electrode and the second electrode, and are respectively and electrically connected to the first electrode and the second electrode,
   a first connection pad and a second connection pad that are respectively and electrically connected to the first opposed electrode and the second opposed electrode,
   a third connection pad electrically connected to the third electrode; and
   the first connection pad, the second connection pad, and the third connection pad are respectively arranged on the first opposed electrode side and the second opposed electrode side of the second light emitting device and, wherein the first light emitting device section, the second light emitting device section, and the third light emitting device section emit light in a wavelength band different from each other.

5. A semiconductor light emitting device formed by layering a first light emitting device and a second light emitting device, wherein:
   the first light emitting device includes
   a stripe-shaped first light emitting device section and a stripe-shaped second light emitting device section that are formed in parallel With each other on a first substrate, and
   a stripe-shaped first electrode and a stripe-shaped second electrode that separately supply current to the first light emitting device section and the second light emitting device section;

the second light emitting device includes
a stripe-shaped third light emitting device section formed on an opposed face side of a second substrate arranged oppositely to the first substrate,
a stripe-shaped third electrode that supplies current to the third light emitting device section,
a stripe-shaped first opposed electrode and a stripe-shaped second opposed electrode that are respectively arranged oppositely to the first electrode and the second electrode, and are respectively and electrically connected to the first electrode and the second electrode,
a first connection pad and a second connection pad that are respectively and electrically connected to the first opposed electrode and the second opposed electrode,
a third connection pad electrically connected to the third electrode; and
the first connection pad, the second connection pad, and the third connection pad are respectively arranged on the first opposed electrode side and the second opposed electrode side of the second light emitting device and,
wherein the first light emitting device section and the second light emitting device section are formed on an opposed face side of the first substrate, and are arranged oppositely to the third light emitting device section.

6. A semiconductor light emitting device formed by layering a first light emitting device and a second light emitting device, wherein:
the first light emitting device includes
a stripe-shaped first light emitting device section and a stripe-shaped second light emitting device section that are formed in parallel with each other on a first substrate, and
a stripe-shaped first electrode and a stripe-shaped second electrode that separately supply current to the first light emitting device section and the second light emitting device section;
the second light emitting device includes
a stripe-shaped third light emitting device section formed on an opposed face side of a second substrate arranged oppositely to the first substrate,
a stripe-shaped third electrode that supplies current to the third light emitting device section,
a stripe-shaped first opposed electrode and a stripe-shaped second opposed electrode that are respectively arranged oppositely to the first electrode and the second electrode, and are respectively and electrically connected to the first electrode and the second electrode,
a first connection pad and a second connection pad that are respectively and electrically connected to the first opposed electrode and the second opposed electrode,
a third connection pad electrically connected to the third electrode; and
the first connection pad, the second connection pad, and the third connection pad are respectively arranged on the first opposed electrode side and the second opposed electrode side of the second light emitting device and,
wherein the first light emitting device section, the second light emitting device section, and the third light emitting device section are respectively a laser device section in which a lower cladding layer, an active layer, and an upper cladding layer are layered in this order in a lamination direction.

7. The semiconductor light emitting device according to claim 2, wherein the second light emitting device comprises:
a welding layer that is formed on the first opposed electrode, and is fused in a state that the first electrode is electrically conducted to the first opposed electrode; and
a first connection portion that electrically connects the first opposed electrode to the first connection pad,
wherein the first opposed electrode has an extending portion that extends in an in-plane direction in a region not facing to a light path of light emitted from the first light emitting device in a surface of the second light emitting device.

8. The semiconductor light emitting device according to claim 1, wherein the second light emitting device comprises: a coat film formed on at least one of an end face on a main emitting side and an end face on the opposite side of the main emitting side; and a convex portion formed on an entire or a partial surface of a region closest to the coat film out of the first connection pad, the second connection pad, and the third connection pad; or formed on a surface between the region in the first light emitting device and the coat film.

9. The semiconductor light emitting device according to claim 8, wherein a height of the welding layer is almost equal to a height of the convex portion.

10. The semiconductor light emitting device according to claim 8, wherein the welding layer is made of a material equal to a material of the convex portion.

11. A semiconductor light emitting device formed by layering a first light emitting device and a second light emitting device, wherein:
the first light emitting device includes
a stripe-shaped first light emitting device section and a stripe-shaped second light emitting device section that are formed in parallel with each other on a first substrate, and
a stripe-shaped first electrode and a stripe-shaped second electrode that separately supply current to the first light emitting device section and the second light emitting device section;
the second light emitting device includes
a stripe-shaped third light emitting device section formed on an opposed face side of a second substrate arranged oppositely to the first substrate,
a stripe-shaped third electrode that supplies current to the third light emitting device section,
a stripe-shaped first opposed electrode and a stripe-shaped second opposed electrode that are respectively arranged oppositely to the first electrode and the second electrode, and are respectively and electrically connected to the first electrode and the second electrode,
a first connection pad and a second connection pad that are respectively and electrically connected to the first opposed electrode and the second opposed electrode,
a third connection pad electrically connected to the third electrode; and
the first connection pad, the second connection pad, and the third connection pad are respectively arranged on the first opposed electrode side and the second opposed electrode side of the second light emitting device and,
wherein the second substrate is a nitride semiconductor substrate having a first region made of a crystal having a first average dislocation density and a second region made of a crystal having a second average dislocation density higher than the first average dislocation density, and
the second region has a high-resistance region on a side surface on the first connection pad, the second connection pad, and the third connection pad side in the third light emitting device section.

12. The semiconductor light emitting device according to claim 11, wherein the high-resistance region is formed by performing ion implantation for a surface on the first connection pad, the second connection pad, and the third connection pad side in the third light emitting device section.

13. A semiconductor light emitting device formed by layering a first light emitting device and a second light emitting device, wherein:
the first light emitting device includes
a stripe-shaped first light emitting device section that is formed on a first substrate, and
a stripe shaped first electrode that supplies a current to the first light emitting device section;
the second light emitting device includes
a stripe-shaped second light emitting device section and a stripe-shaped third light emitting device section that are formed in parallel with each other on an opposed face side of a second substrate arranged oppositely to the first substrate,
a stripe-shaped second electrode and a stripe-shaped third electrode that separately supply current to the second light emitting device section and the third light emitting device section,
a stripe-shaped first opposed electrode that is arranged oppositely to the first electrode and is electrically connected to the first electrode,
a first connection pad that is electrically connected to the first opposed electrode, and
a second connection pad and a third connection pad that are respectively and electrically connected to the second electrode and the third electrode; and
the first connection pad, the second connection pad, and the third connection pad are respectively arranged on the first opposed electrode side, wherein the first connection pad, the second connection pad, and the third connection pad are arranged side by side in a stripe-shaped region in parallel with the first opposed electrode.

14. A semiconductor light emitting device formed by layering a first light emitting device and a second light emitting device, wherein:
the first light emitting device includes
a stripe-shaped first light emitting device section that is formed on a first substrate, and
a stripe-shaped first electrode that supplies a current to the first light emitting device section;
the second light emitting device includes
a stripe-shaped second light emitting device section and a stripe-shaped third light emitting device section that are formed in parallel with each other on an opposed face side of a second substrate arranged oppositely to the first substrate,
a stripe-shaped second electrode and a stripe-shaped third electrode that separately supply current to the second light emitting device section and the third light emitting device section,
a stripe-shaped first opposed electrode that is arranged oppositely to the first electrode and is electrically connected to the first electrode,
a first connection pad that is electrically connected to the first opposed electrode, and
a second connection pad and a third connection pad that are respectively and electrically connected to the second electrode and the third electrode; and
the first connection pad, the second connection pad, and the third connection pad are respectively arranged on the first opposed electrode side further comprising:
a mark between the first connection pad and the second connection pad, and between the second connection pad and the third connection pad.

15. A semiconductor light emitting device formed by layering a first light emitting device and a second light emitting device, wherein:
the first light emitting device includes
a stripe-shaped first light emitting device section that is formed on a first substrate, and
a stripe-shaped first electrode that supplies a current to the first light emitting device section;
the second light emitting device includes
a stripe-shaped second light emitting device section and a stripe-shaped third light emitting device section that are formed in parallel with each other on an opposed face side of a second substrate arranged oppositely to the first substrate,
a stripe-shaped second electrode and a stripe-shaped third electrode that separately supply current to the second light emitting device section and the third light emitting device section,
a stripe-shaped first opposed electrode that is arranged oppositely to the first electrode and is electrically connected to the first electrode,
a first connection pad that is electrically connected to the first opposed electrode, and
a second connection pad and a third connection pad that are respectively and electrically connected to the second electrode and the third electrode; and
the first connection pad, the second connection pad, and the third connection pad are respectively arranged on the first opposed electrode side further comprising:
a pair of marks arranged to sandwich the first connection pad, the second connection pad, and the third connection pad in a parallel direction.

16. An optical pickup unit comprising a light source, and an optical system provided between a region where a recording medium is mounted and the light source, wherein:
the light source includes
a semiconductor light emitting device formed by layering a first light emitting device and a second light emitting device;
the first light emitting device includes
a stripe-shaped first light emitting device section and a stripe-shaped second light emitting device section that are formed in parallel with each other on a first substrate, and
a stripe-shaped first electrode and a stripe-shaped second electrode that separately supply current to the first light emitting device section and the second light emitting device section; and
the second light emitting device includes
a stripe-shaped third light emitting device section that is formed on an opposed face side of a second substrate arranged oppositely to the first substrate,
a stripe-shaped third electrode that supplies current to the third light emitting device section,
a stripe-shaped first opposed electrode and a stripe-shaped second opposed electrode that are respectively arranged oppositely to the first electrode and the second electrode and are respectively and electrically connected to the first electrode and the second electrode,
a first connection pad and a second connection pad that are respectively and electrically connected to the first opposed electrode and the second opposed electrode, and
a third connection pad electrically connected to the third electrode; and the first connection pad, the second connection pad, and the third connection pad are respectively arranged on the first opposed electrode side and the second opposed electrode side.

17. An optical pickup unit comprising, a light source, and an optical system provided between a region where the recording medium is mounted and the light source, wherein:
the light source includes
a semiconductor light emitting device formed by layering a first light emitting device and a second light emitting device;
the first light emitting device includes
a stripe-shaped first light emitting device section that is formed on a first substrate, and
a stripe-shaped first electrode that supplies current to the first light emitting device section;
the second light emitting device includes
a stripe-shaped second light emitting device section and a stripe-shaped third light emitting device section that are formed in parallel with each other on an opposed face side of a second substrate arranged oppositely to the first substrate,
a stripe-shaped second electrode and a stripe-shaped third electrode that separately supply current to the second light emitting device section and the third light emitting device section,
a stripe-shaped first opposed electrode that is arranged oppositely to the first electrode and is electrically connected to the first electrode,
a first connection pad that is electrically connected to the first opposed electrode, and
a second connection pad and a third connection pad that are respectively and electrically connected to the second electrode and the third electrode; and
the first connection pad, the second connection pad, and the third connection pad are respectively arranged on the first opposed electrode side.

18. An information recording/reproduction apparatus comprising an optical pickup unit, and an information processing section that sends inputted information to the optical pickup unit and receives information recorded in a recording medium from the optical pickup unit, wherein:
the optical pickup unit includes
a light source, and
an optical system provided between a region where the recording medium is mounted and the light source;
the light source includes
a semiconductor light emitting device formed by layering a first light emitting device and a second light emitting device;
the first light emitting device includes
a stripe-shaped first light emitting device section and a stripe-shaped second light emitting device section that are formed in parallel with each other on a first substrate, and
a stripe-shaped first electrode and a stripe-shaped second electrode that separately supply current to the first light emitting device section and the second light emitting device section;
the second light emitting device includes
a stripe-shaped third light emitting device section that is formed on an opposed face side of a second substrate arranged oppositely to the first substrate,
a stripe-shaped third electrode that supplies current to the third light emitting device section,
a stripe-shaped first opposed electrode and a stripe-shaped second opposed electrode that are respectively arranged oppositely to the first electrode and the second electrode and are respectively and electrically connected to the first electrode and the second electrode,
a first connection pad and a second connection pad that are respectively and electrically connected to the first opposed electrode and the second opposed electrode, and
a third connection pad electrically connected to the third electrode; and
the first connection pad, the second connection pad, and the third connection pad are respectively arranged on the first opposed electrode side and the second opposed electrode side.

19. An information recording/reproduction apparatus comprising an optical pickup unit, and an information processing section that sends inputted information to the optical pickup unit and receives information recorded in a recording medium from the optical pickup unit, wherein:
the optical pickup unit includes
a light source, and
an optical system provided between a region where the recording medium is mounted and the light source;
the light source includes
a semiconductor light emitting device formed by layering a first light emitting device and a second light emitting device;
the first light emitting device includes
a stripe-shaped first light emitting device section that is formed on a first substrate, and
a stripe-shaped first electrode that supplies current to the first light emitting device section;
the second light emitting device includes
a stripe-shaped second light emitting device section and a stripe-shaped third light emitting device section that are formed in parallel with each other on an opposed face side of a second substrate arranged oppositely to the first substrate,
a stripe-shaped second electrode and a stripe-shaped third electrode that separately supply current to the second light emitting device section and the third light emitting device section,
a stripe-shaped first opposed electrode that is arranged oppositely to the first electrode and is electrically connected to the first electrode,
a first connection pad that is electrically connected to the first opposed electrode, and
a second connection pad and a third connection pad that are respectively and electrically connected to the second electrode and the third electrode; and
the first connection pad, the second connection pad, and the third connection pad are respectively arranged on the first opposed electrode side.

* * * * *